United States Patent [19]

Conley et al.

[11] Patent Number: 5,235,232
[45] Date of Patent: Aug. 10, 1993

[54] ADJUSTABLE-OUTPUT ELECTRICAL ENERGY SOURCE USING LIGHT-EMITTING POLYMER

[75] Inventors: Jerry J. Conley; Gary B. Mortensen, both of Waseca, Minn.

[73] Assignee: E. F. Johnson Company, Waseca, Minn.

[21] Appl. No.: 578,032

[22] Filed: Sep. 4, 1990

Related U.S. Application Data

[63] Continuation-in-part of Ser. No. 318,743, Mar. 3, 1989, Pat. No. 5,008,579.

[51] Int. Cl.⁵ .................... H01L 31/06; H02J 7/34; G05F 1/613
[52] U.S. Cl. ................... 310/303; 310/305; 429/5; 323/906
[58] Field of Search ............. 310/303, 305; 429/5; 136/202, 290–293; 320/32, 43, 45, 51; 323/293, 906; 322/88, 7; 976/DIG. 410, 412, 418–420

[56] References Cited

U.S. PATENT DOCUMENTS

| | | |
|---|---|---|
| 1,640,393 | 8/1927 | Coblentz . |
| 2,259,372 | 10/1941 | Geisler . |
| 2,847,585 | 8/1958 | Christian . |
| 3,005,942 | 10/1961 | Perdreaux et al. ............ 310/305 |
| 3,031,519 | 4/1962 | Silverman . |
| 3,033,797 | 5/1962 | DeLeo . |
| 3,037,067 | 5/1962 | Bartolomei . |
| 3,053,927 | 9/1962 | Viszlocky ............ 310/305 |
| 3,094,634 | 6/1963 | Rappaport . |
| 3,304,445 | 2/1967 | Weddell et al. . |
| 3,325,420 | 6/1967 | Futterknecht . |
| 3,342,743 | 9/1967 | Rosenberg . |
| 3,483,040 | 12/1969 | Parkins . |
| 3,591,420 | 7/1971 | Streed . |
| 3,620,917 | 11/1971 | Flaherty ............ 136/202 |
| 3,737,689 | 6/1973 | Schuerholz ............ 310/303 |
| 3,740,273 | 6/1973 | Adler et al. . |
| 3,767,947 | 10/1973 | Adler et al. . |
| 3,843,896 | 10/1974 | Rason et al. ............ 310/4 |
| 3,939,366 | 2/1976 | Ato et al. . |
| 4,020,003 | 4/1977 | Steinberg et al. . |
| 4,024,420 | 5/1977 | Anthony et al. . |
| 4,075,034 | 2/1978 | Butler . |
| 4,118,633 | 10/1978 | Guilleman et al. . |
| 4,175,249 | 11/1979 | Gruber ............ 323/15 |
| 4,213,052 | 7/1980 | Caffarella et al. . |
| 4,242,147 | 12/1980 | DeToia . |
| 4,327,318 | 4/1982 | Kwon et al. . |
| 4,328,456 | 5/1982 | Suzuki et al. ............ 323/906 |
| 4,374,749 | 2/1983 | Cusano et al. . |
| 4,375,423 | 3/1983 | Cusano et al. . |
| 4,551,669 | 11/1985 | Itoh et al. ............ 323/268 |
| 4,577,052 | 3/1986 | Schutten et al. . |
| 4,628,143 | 12/1986 | Brotz . |
| 4,677,008 | 6/1987 | Webb . |
| 4,728,878 | 3/1988 | Anthony ............ 322/88 |
| 4,730,115 | 3/1988 | Abe . |
| 4,835,433 | 5/1989 | Brown . |
| 4,889,660 | 12/1989 | Jensen et al. . |
| 4,900,368 | 2/1990 | Brotz . |
| 5,001,415 | 3/1991 | Watkinson ............ 323/906 |
| 5,008,579 | 4/1991 | Conley et al. ............ 310/303 |
| 5,082,505 | 1/1992 | Cota et al. ............ 136/253 |

FOREIGN PATENT DOCUMENTS

| | | |
|---|---|---|
| 227258 | 8/1959 | Australia . |
| 615938 | 3/1961 | Canada . |
| 0204167 | 12/1986 | European Pat. Off. . |
| 51-073393 | 6/1976 | Japan . |
| 638106 | 5/1950 | United Kingdom . |

OTHER PUBLICATIONS

A. Van der Ziel, *Solid State Physical Electronics*, 1957, p. 390.
G. Foldiak, *Industrial Applications Isotopes*, 1986, p. 387.
Yang, *Fundamentals of Semiconductor Devices*, 1978, pp. 147–162.
"Power Sources for Space Explored", *Aviation Week*, vol. 68, Jun. 16, 1958, pp. 235, 237, 239, and 241.
D. A. Sukhov and F. I. Vilesov, "Photoionization of Aromatic Hydrocarbons Dissolved in Polymethyl Methacrylate and Polystyrene", Proc. IRC, vol. 4, No. 8; pp. 134–136.

*Primary Examiner*—Nelson Moskowitz
*Attorney, Agent, or Firm*—Patterson & Keough

[57] ABSTRACT

A long-life, electrical energy source having an adjustable output is comprised of a light emitting phosphor activated by a radioisotope and coupled to a plurality of photovoltaic cells that have their outputs electrically connected together. The output power of the electrical energy source is effectively regulated by selectively changing the connections of the outputs of the photovoltaic cells in response to the progression of time.

7 Claims, 18 Drawing Sheets

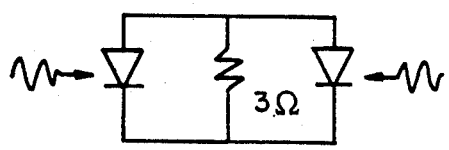
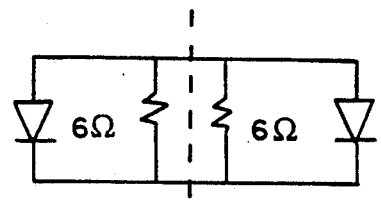
Fig. 20  Fig. 21
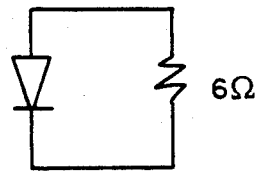
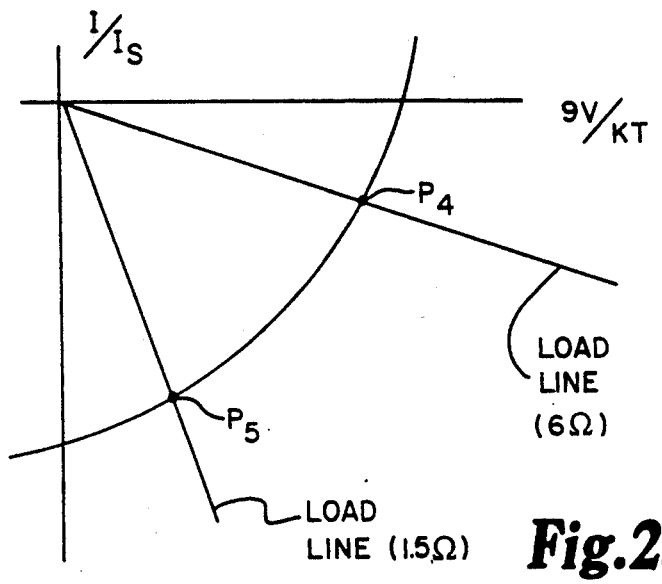
Fig. 22  Fig. 23
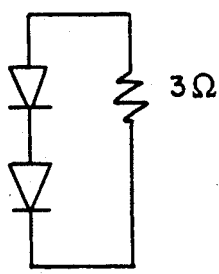
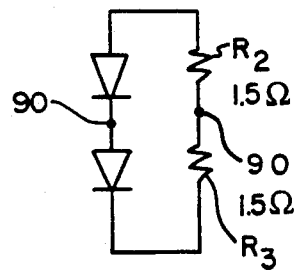
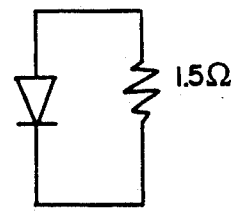
Fig. 24  Fig. 25  Fig. 26

ADJUSTABLE-OUTPUT ELECTRICAL ENERGY SOURCE USING LIGHT-EMITTING POLYMER

RELATED APPLICATIONS

This application is a continuation-in-part of an application entitled LIGHT EMITTING POLYMER ELECTRICAL ENERGY SOURCE, filed in the United States Patent and Trademark Office on Mar. 3, 1989, Ser. No. 07/318,743 now issued as U.S. Pat. No. 5,008,579, which was assigned to the assignee of the present invention, and which is hereby incorporated by reference. A copy of the original application is attached, and part of the disclosure of this application is contained herein in the section entitled "Technical Addendum."

TECHNICAL FIELD

The invention pertains to the use of a radioactive isotope to generate electric power. The isotope decays, producing Beta-radiation, which induces a phosphor to produce light. The light strikes photodiodes, which produce the electric power. As time passes, the Beta-radiation diminishes in intensity, causing the light intensity to diminish, causing the output of the photodiodes to diminish. In order to counteract this diminution, the photodiodes are periodically reconfigured in different series-parallel arrangements. The reconfiguration increases the output voltage of the system.

BACKGROUND ART

Various types of energy sources, consisting of photocells activated by some type of nuclear radiation, are known in the prior art. These devices, sometimes referred to as "nuclear batteries" or "atomic batteries," generally convert nuclear electromagnetic radiation into electrical energy by one of two methods, namely, single conversion or double conversion. Single conversion nuclear batteries generate electrical energy by converting the nuclear radiation (i.e. alpha particles, beta particles, gamma radiation or x-rays) into electrical energy by direct absorption of the nuclear radition at the p-n junction of a semiconductor material. U.S. Pat. Nos. 3,094,634, 3,304,445 and 4,024,420 are exemplary.

Double conversion nuclear batteries generate electrical energy by converting the nuclear radiation into electromagnetic radiation, usually by irradiating a phosphorescent material that will generate light in the visible spectrum, and then converting that electromagnetic radiation into electrical energy by absorbtion of the electromagnetic radiation at the p-n junction of a semiconductor material, usually a typical photovoltaic cell. U.S. Pat. Nos. 3,031,519, 3,053,927, and 3,483,040 are exemplary.

Although a variety of self-luminous, low light sources have been available for a long time (e.g. radium- and tritium-activated phosphors used for creating self-luminous paints for watch dials, etc., U.S. Pat. Nos. 3,033,797, 3,325,420 and 3,342,743), it has generally been regarded that such materials were unsuitable for commercial use for the conversion of light into electricity. The low levels of radioactivity associated with such materials, though generally not harmful or dangerous, do not provide an adequate source of power for the nuclear batteries of the type known in the prior art. In addition to the low light level (50 micro-lamberts or less), such sources may also be characterized by rapid and unpredictable light decay and, in the case of radium-activated light sources, may produce undesirable radiation hazards associated with their decay products.

Further, even if the decay is slow and predictable, decay nevertheless exists, which causes the level of illumination to diminish with the passage of time. This diminution causes the output voltage of the battery to diminish as time progresses.

Though the concept of a long-life, electrical energy source activated by a radioactive material is attractive and has many potential applications, none of the prior art devices have been able to create a safe, yet sufficiently powerful, energy source that is commercially feasible. Accordingly, there is a continuing need to develop a safe, practical, long-lived, electrical energy source of constant voltage which is powered by a radioactive source.

SUMMARY OF THE INVENTION

In one form of the invention, a light emitter illuminates a group of photovoltaic cells. The light is produced by a phosphor in response to nuclear radiation produced by a decaying isotope. Because such light will decrease in intensity as time passes, the voltage produced by the photovoltaic cell will also decrease. To counteract this decrease, the invention periodically reconfigures the series-parallel arrangement of the cells. For example, the cells can initially be placed in parallel with each other; later, they can be all placed in series.

In another embodiment of the present invention, the light emitter is optically separated from the photovoltaic cell by an optical control means for controlling the amount of light that may pass through the optical control means to be absorbed by the photovoltaic cell. The optical control means may be a liquid crystal display (LCD) or lead lantium zirconium titinate (PLZT) or similar material that becomes either transparent or opaque, depending upon the voltage or current applied to the material. By controlling the amount of light that may be absorbed by the photovoltaic cell, the optical control means also controls the output of the photovoltaic cell and, hence, operates as either a voltage or current regulator, depending upon the particular circuit that utilizes the electrical energy source of the present invention.

In one mode of operation, the phosphor is designed to initially produce more light than is needed by the photovoltaic cells. The optical control means blocks the unneeded light. Later, when the light intensity has decreased, the control means allows a greater fraction of the light to pass, thereby maintaining constant the intensity of light striking the photovoltaics.

Further, the optical control means allows the electrical energy source of the present invention to simulate an alternating current source from a direct current source without the need for electrical circuitry external to the electrical energy source. In addition, by the reconfiguration described above, the voltage drop ordinarily occurring with the passage of time can be eliminated: alternating current of constant voltage can be obtained.

The present invention provides a novel radioisotope-activated, electrical energy source that exhibits several desirable characteristics. Foremost, the voltage output can be maintained above a minimum threshold level, for periods of time extending into years. The electrical energy source of the present invention is relatively safe and is, thus, viable for general commercial use when the quantities of radioactivity are generally below 100 curies. The low emissivity and high energy density of the preferred embodiment utilizing a tritiated organic polymer to which an organic phosphor or scintillant is bonded enable the electrical energy source to realistically utilize 4.0% or more of the theoretical 3.6 amp-hours of electrical energy that are present in each curie of tritium. In this embodiment, an electrical energy source having 100 curies of tritium is capable of providing 1 microwatt of power at 1 volt and 1 microamp for the entire lifetime of the electrical energy source, approximately 20 years.

Because the electrical energy generated by the present invention is dependent upon the rate of emission of photons from the light emitting polymer (which is in turn dependent upon the rate of beta-emissions from the radioisotope used to activate the light emitting polymer), the amount of energy available is stable and determinable. In addition to providing a unique source of electrical energy for CMOS, NMOS and other low power types of electronic circuitry, the output stability of the electrical energy source of the present invention makes it ideally suited for applications that require a very constant source of power and ensure that it is not drained of its energy if subjected to a short-circuit. Moreover, the materials and packaging of the present invention can be selected to enable the electrical energy source to operate in a cryogenic environment without significant degradation of the power compared to conventional chemical batteries, because the rate of conversion of the photons by the photovoltaic cell is positively affected by decreasing temperature.

Although light emitting polymers have been available for a number of years for various uses (primarily as self-luminescent paints), it is not known to use such light emitting polymers to power electrical energy sources. The present invention has discovered their usefulness for this purpose and, more importantly, the adaptability of light emitting polymers, as compared to other prior art radioisotope vehicles, to permit the design of electrical energy sources with greater efficiency and safety than in prior art devices.

Accordingly, a primary objective of the present invention is to provide a safe, yet sufficiently powerful, long-life, radioisotope-powered electrical energy source that is commercially feasible.

Another objective of the invention is to provide a long-life source of electrical energy which maintains a minimum voltage output for a useful length of time.

Another objective of the present invention is to provide a long-life source of electrical energy by the combination of a radioisotope-activated, light emitting polymer and a photovoltaic cell.

A further objective of the present invention is to provide an electrical energy source wherein the conversion efficiency by a photovoltaic cell of light emitted by a light emitting polymer is maximized.

An additional objective of the present invention is to provide an electrical energy source that includes an optical control means for controlling the amount of electrical energy generated by controlling the amount of light that is received by the photovoltaic cell from a light source.

A still further objective of the present invention is to provide a long-life, electrical energy source that provides a consistent power output by generating electrical energy at a constant watt-hour rate.

A still further object of the present invention is to provide an electrical energy source which can be reconfigured in order to place voltage sources into a selected series/parallel configuration, thereby changing the total output voltage. When the reconfiguration is done under automatic control, the energy source becomes programmable: a selected sequence of voltages can be obtained.

These and other objectives of the present invention will become apparent with reference to the drawings, the detailed description of the preferred embodiment and the appended claims.

DESCRIPTION OF THE DRAWINGS

FIG. 20 illustrates two photodiodes driving a load in parallel.

FIG. 21 illustrates an equivalent circuit to that of FIG. 20.

FIG. 22 illustrates the effective load seen by one of the diodes in FIG. 20.

FIG. 23 illustrates the operating point $P_4$ for the diode in FIG. 22.

FIG. 24 illustrates two photodiodes driving a load in series.

FIG. 25 illustrates an equivalent circuit to that of FIG. 24.

FIG. 26 illustrates the equivalent load seen by either of the diodes in FIG. 25.

DESCRIPTION OF THE PREFERRED EMBODIMENTS

Nuclear-Powered Photovoltaic Battery

Figure 1:
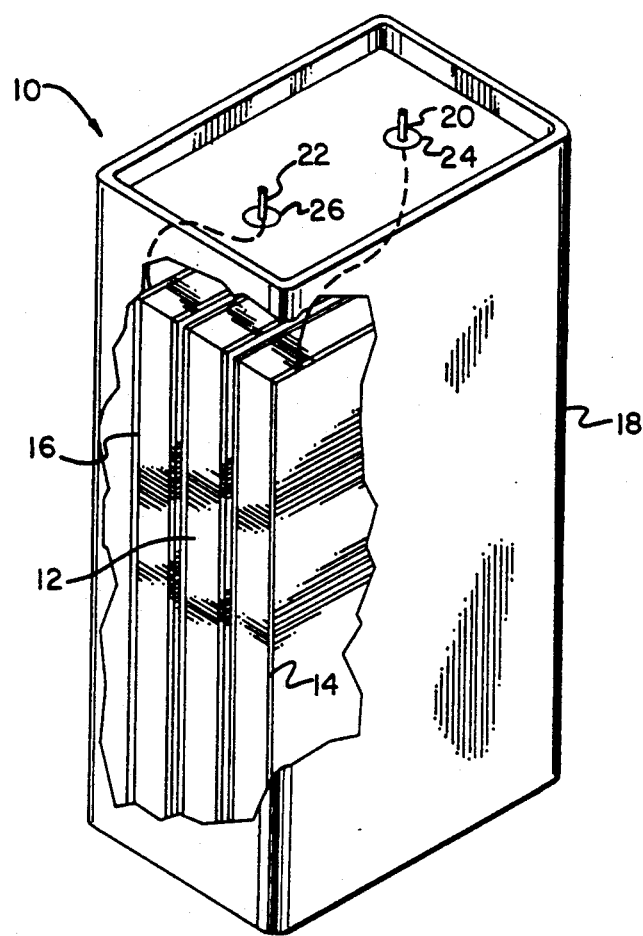
FIG. 1 illustrates one form of the invention.

In FIG. 1, a cut-away pictorial representation of the preferred embodiment of the present invention is shown. The electrical energy source 10 is comprised of a planar sheet of light emitting polymer ("LEP") material 12 that is interposed between a pair of photovoltaic cells 14 and 16 having planar dimensions similar to the LEP material 12. The photovoltaic cells 14 and 16 and the LEP material 12 are encased in a sealed case 18, preferably a laser-welded, stainless steel case, having a pair of electrical contacts 20 and 22 exposed on one end of the case 18. The contacts 20 and 22 are disposed in a pair of ceramic insulators 24 and 26 and are connected to the photovoltaic cells 14 and 16 in such a manner that one of the contacts will provide a positive voltage potential and the other contact will provide a negative voltage potential.

In the preferred embodiment, the LEP material 12 is a tritiated organic polymer to which an organic phosphor or scintillant is bonded. Such an LEP material was obtained from Amersham International plc, Amersham Place, Little Chalfont, Buckinghamshire, England, and, pending NRC regulatory approval, may be available from Amersham International plc. Such an LEP material is described in the United Kingdom patent application, Ser. No. 890,5297.1 by Colin D. Bell, entitled TRITIATED LIGHT EMITTING POLYMER COMPOSITION, filed in the British Patent Office on Mar. 8, 1989, the disclosure of which is hereby incorporated by reference herein. It should be recognized that other types of LEP material known in the prior art may also be utilized with the present invention. (e.g., U.S. Pat. Nos. 3,003,797, 3,325,420 and 3,342,743). Those aspects of the LEP material 12 that allow it to be used effectively in the present invention are discussed below in connection with the various design considerations set forth above.

In the preferred embodiment, the photovoltaic cells 14 and 16 are amorphous thin-film silicon solar cells, Model No. 035-01581-01, available from ARCO Solar, Inc., Chatsworth, Calif., or their equivalent. These cells have their highest efficiency conversion (greater than 20%) in the blue range of the spectrum of visible light to match the frequency bandwidth of the emitted light of LEP material incorporating a phosphor that emits in the blue range. While the particular photovoltaic cells 14 and 16 in the preferred embodiment have been selected to match the blue range of the spectrum of visible light, it should be apparent that other photovoltaic cells may be selected to match the bandwidth of light emitted at other frequencies. In particular, as discussed below, it is known that a new solar cell, known as the Sunceram II (trademark), available from Panasonic's Industrial Battery Sales Div., is claimed to be more efficient than conventional amorphous silicon solar cells, especially in the red range of the spectrum of visible light.

To maximize the optical transfer between the LEP material 12 and the photovoltaic cells 14 and 16, the surfaces of the photovoltaic cells 14 and 16 not in contact with the LEP material 12 are coated with a reflective material, preferably an aluminum paint or equivalent. The edges of the LEP material 12 not in contact with the photovoltaic cells 14 and 16 are clad with a similar reflective material. The surfaces of the LEP material 12 and the photovoltaic cells 14 and 16 that abut one another are coated with a contact gel, Rheogel 210C, available from Synthetic Technology Corp., McLain, Va., or its equivalent, as a means for optically coupling the surfaces to increase the amount of light that is transmitted from the LEP.

Battery Voltage Droops with Time

The isotope decays at an exponential rate, so that the intensity of Beta radiation conforms to the following first-order differential equation: $dX/dT = kX$, wherein X is the number of isotope atoms present, T is time, and $dX/dT$ is the rate of change of the number of isotope atoms. One solution to this equation is $$X = \exp(kT).$$

This solution indicates two important facts. First, the concentration of remaining, undecayed isotope atoms (ie, X) is an exponential function of the time elapsed. Second, since the intensity of Beta-radiation is proportional to X, the light intensity also decays exponentially as time progresses, causing the output of the photovoltaics to decay in a similar manner. The output voltage droops as time passes.

Photovoltaics are Reconnected in Series, To Counteract Voltage Drop

In order to counteract this voltage droop, the series-parallel interconnections among the individual photovoltaics are changed, in order to obtain different output voltages. In a very simplified sense, the change is somewhat analogous to changing two flashlight batteries from a parallel connection to a series connection when their voltage drops because of usage.

Simple Example

Figure 2:
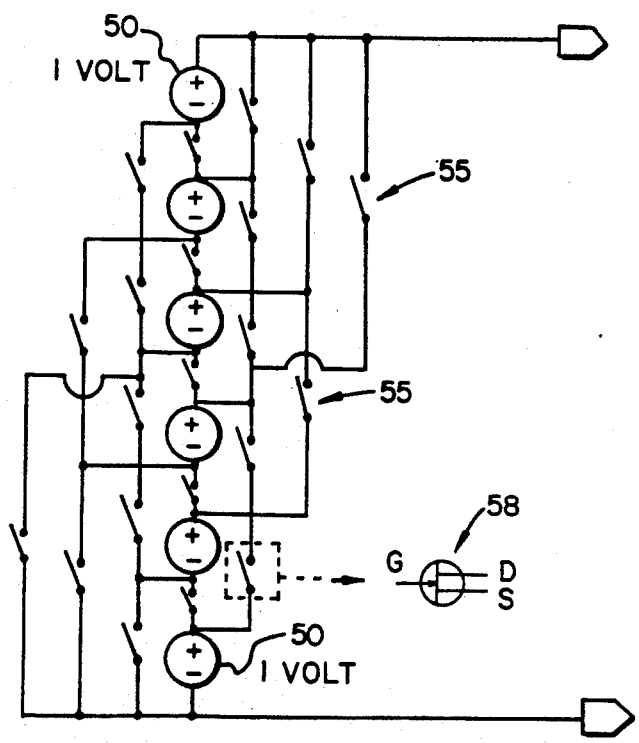
FIG. 2 shows a switching network which can place voltage sources in different series-parallel combinations, in order to change the total output voltage.

FIG. 2 shows six voltage sources 50, which are analogous to the photovoltaics. A system of switches 55 changes the output voltage by rearranging the series-parallel interconnections among the photovoltaics. For example, when the switches are arranged so that they close the current paths shown by the heavy lines in FIG. 3, the total output voltage is one volt; the voltage sources are in parallel. When the switches form the heavy current paths of FIGS. 4, 4A, and 5, the total output voltages are 2,3, and 6 volts, respectively. Thus, by rearranging the series-parallel combination of the photovoltaics, the output voltage can be adjusted.

When the voltage sources take the form of the photovoltaics of the type shown in FIG. 1, this rearrangement can provide a constant voltage despite the fact that the tritium supply is being consumed and thus the intensity of Beta-radiation is diminishing.

The switches in FIG. 2 can be Field-Effect Transistors (FETs), as indicated by the FET symbol 58 in FIG. 2. One suitable FET is model number MPF 481, available from Motorola Corporation, located in Phoenix, Ariz. Such transistors, for present purposes, present a virtual open circuit (ie, impendence is $1.6 \times 10^9$, or 1.6 giga-ohms) when in their OFF state, and act as a resistor of about 140 ohms when in their ON state and carrying a current less than 1 milliamp. Switching the MOSFETS from the OFF state to the ON state requires a very small gate current, such as 1 nano-amp (ie, $1.0 \times 10^{-9}$ amp).

Figure 6:
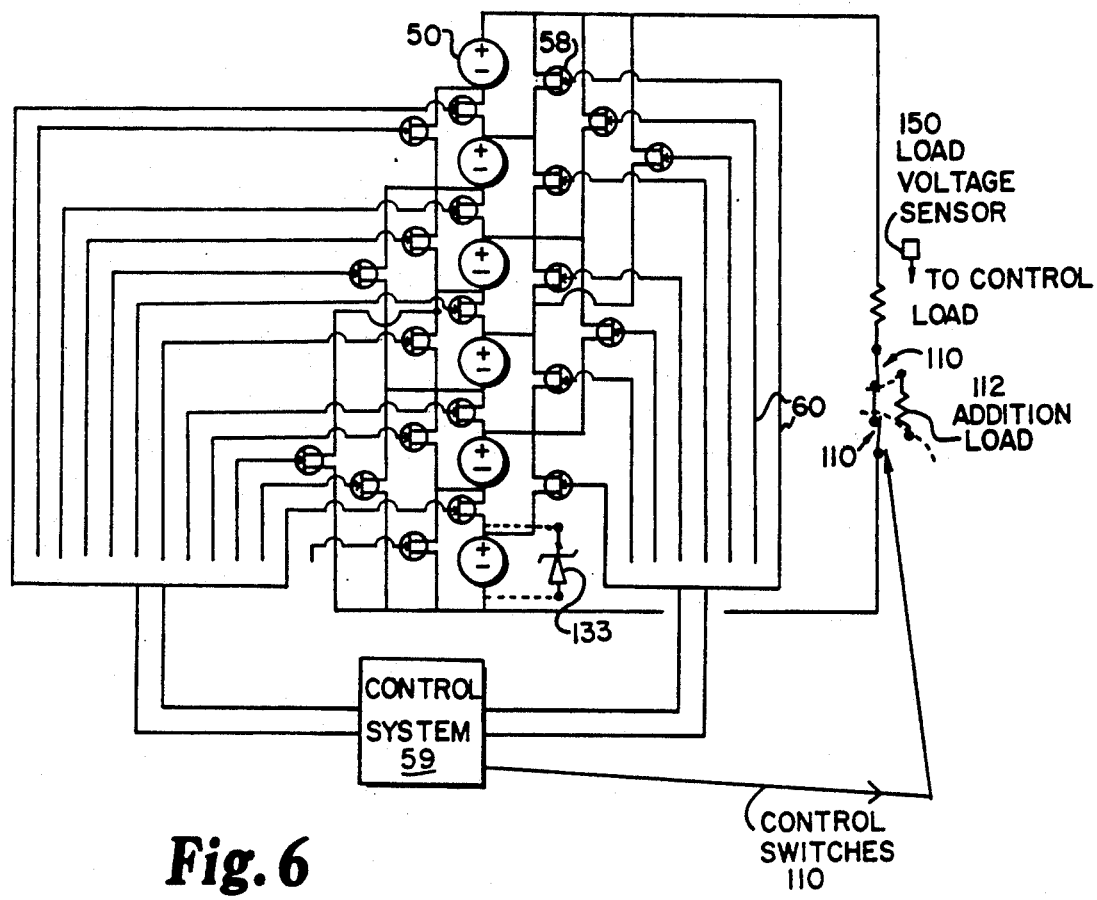
FIG. 6 shows field-effect transistors used as the switches in FIG. 2, and a control system, such as a small computer, which controls the switches.

The FETs are controlled by a control system 59, shown in FIG. 6, which is known in the art. The gate line 60 to each MOSFET can be viewed as one digit in a multi-digit word. If one hundred MOSFETS were used, the word would be one hundred bits long. Equipment is commercially available which can generate a one-hundred-bit word and apply it to the bus consisting of the gate lines.

More Complex Example

Figure 7:
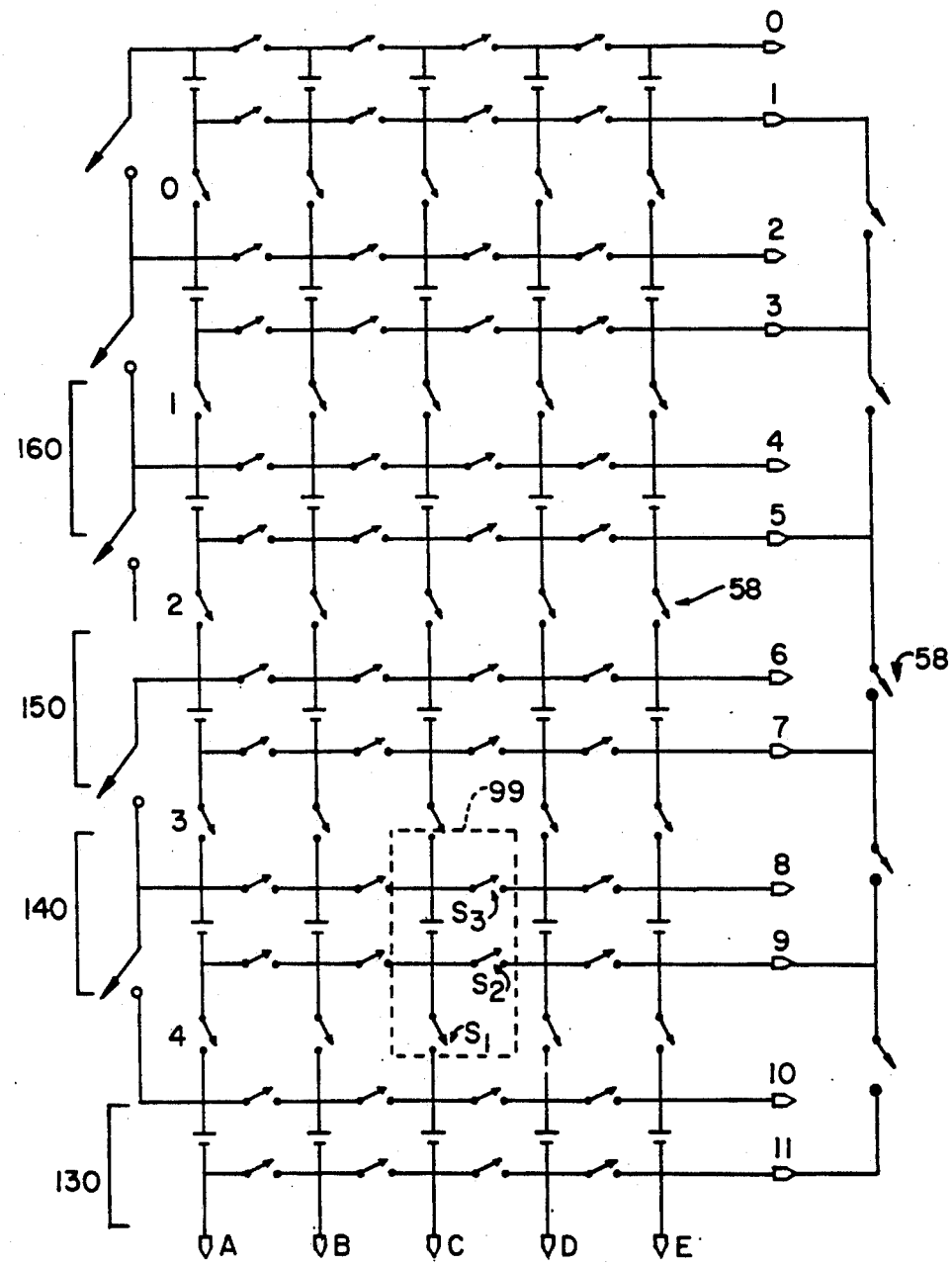
FIG. 7 shows a more complex switching network, similar in function to that of FIG. 2.
Figure 8:
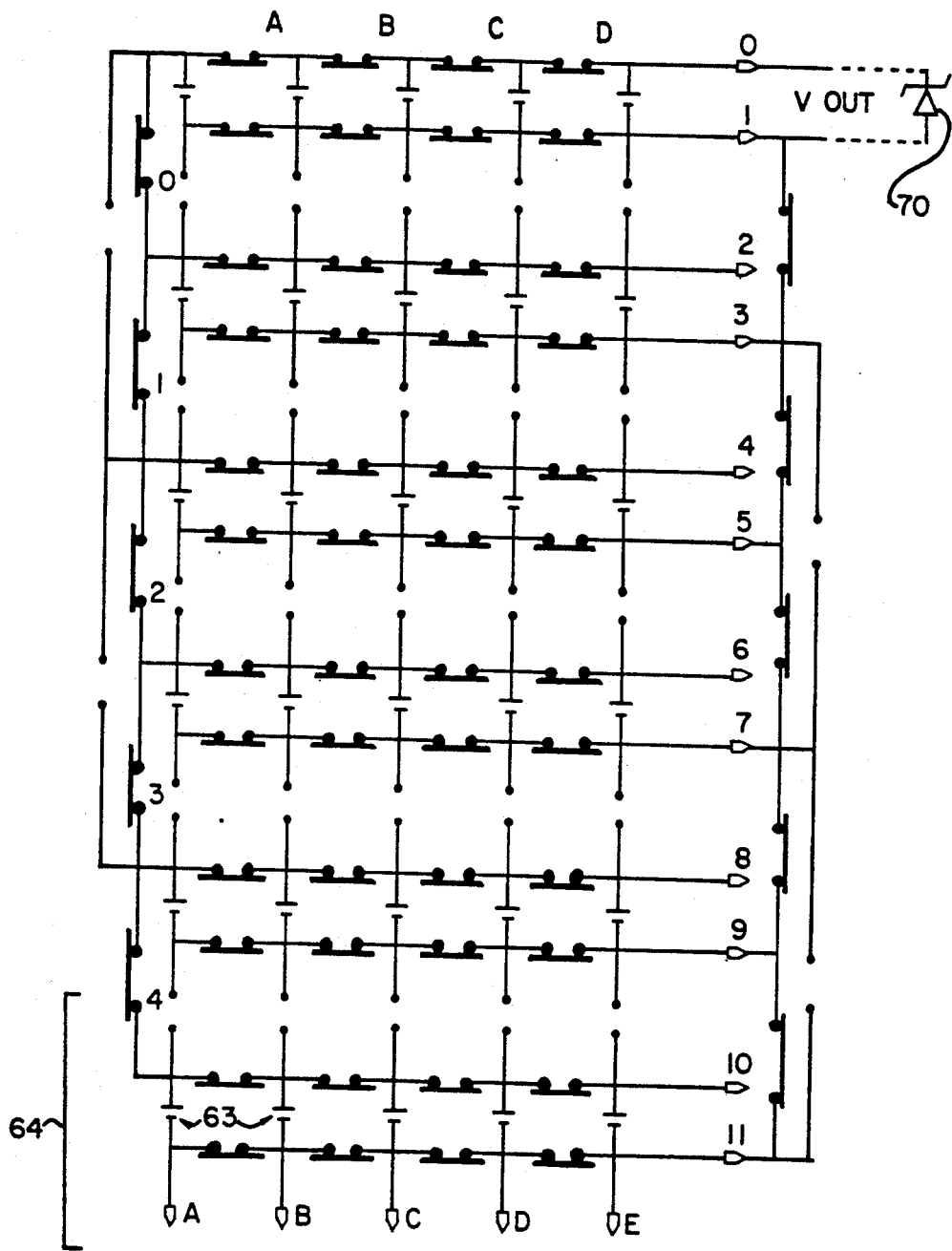
FIGS. 8, 9, 10, and 11 show different switch configurations of the apparatus of FIG. 7.

A more complex form of the invention is shown in FIG. 7. The FETs are represented by mechanical switches 58. Initially, the photodiodes 63 are connected in parallel, as shown in FIG. 8: six identical groups 64 of five diodes each are connected in parallel, and the diodes 63 within each group are also in parallel. If the voltage drop across each diode is $V_d$, and the total output voltage is also $V_d$.

Figure 9:
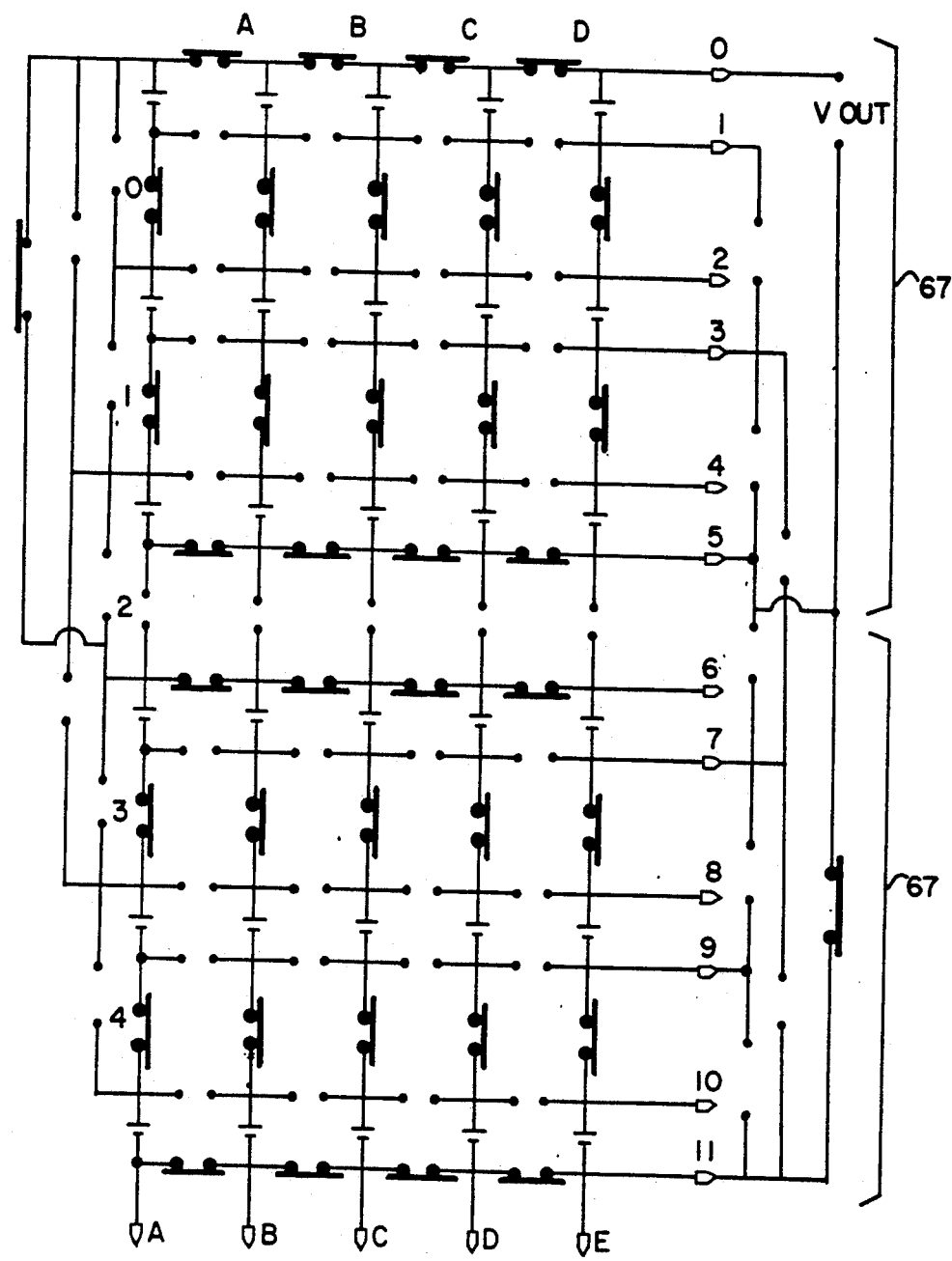

After time has passed, the proper FETs are actuated, in order to create the connections shown in FIG. 9. Now, all photodiodes in each group 67 are in parallel, and these groups are in series. The total output voltage is $2 \times V_d$.

Figure 10:
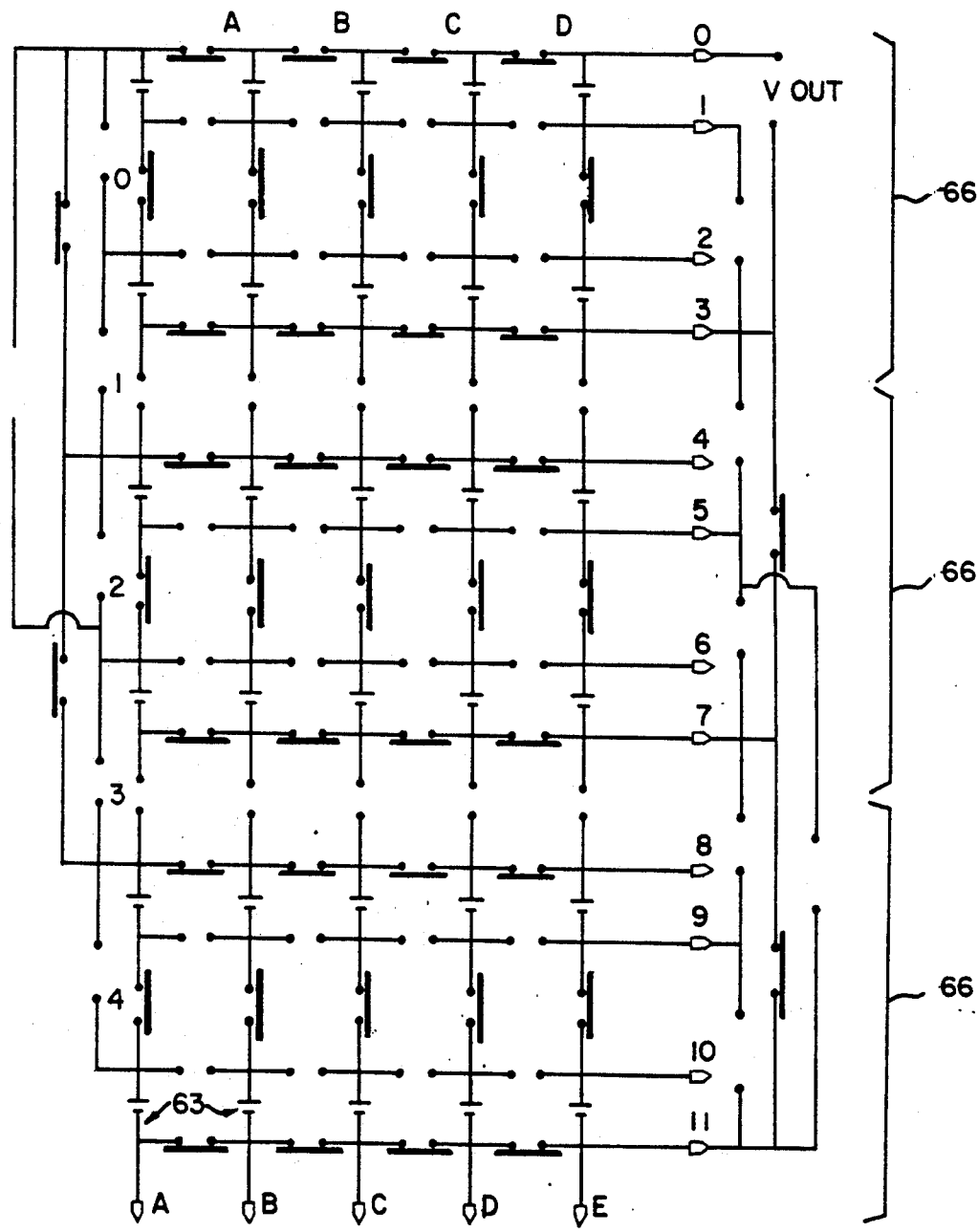

After a further time has passed, the connections shown in FIG. 10 are implemented. Now, the photodiodes in each of groups 66 are in parallel, and the three groups are in series. The total output voltage is $3 \times V_d$.

Figure 11:
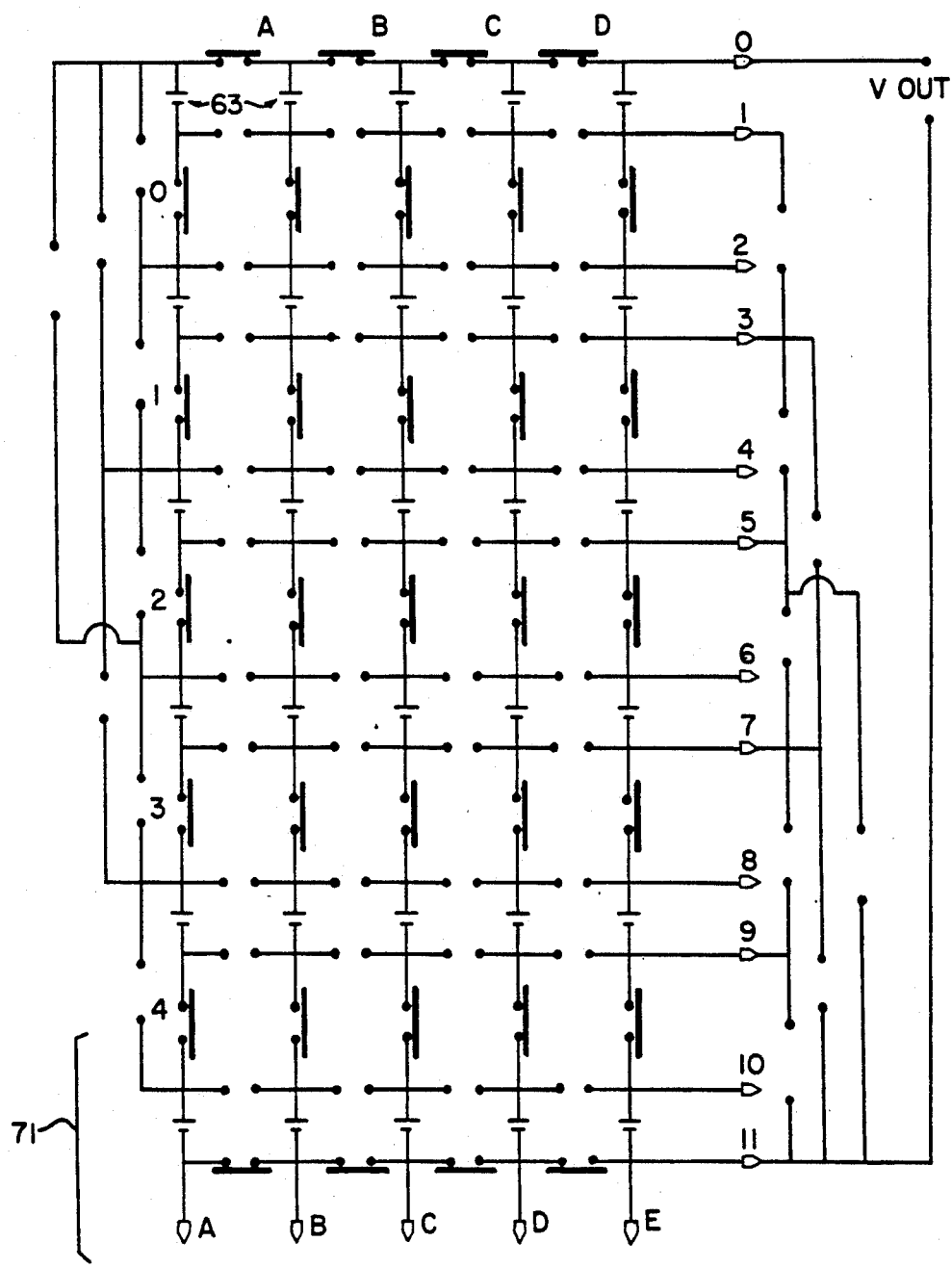

Finally, the connections of FIG. 11 are made. There are six groups 71 of diodes, and the five diodes in each group are in parallel, with the groups in series. The total output voltage is $6 \times V_d$.

In this example, the array of 30 photodiodes are first arranged so that all are in parallel. Then, two groups (of 15 parallel diodes each) are placed in series. Then, three groups (of 10 parallel diodes each) are placed in series. Finally, six groups (of 5 parallel diodes each) are placed in series. This rearrangement increases the output voltage provided by the diode assembly, although, as will be explained later, $V_d$ does not remain constant, and, as a result, the output voltage does not exactly double, then triple, and so forth.

It is noted that the array can be viewed as a collection of identical units 99 in FIG. 7. Each unit contains a photovoltaic 63, a switch $S_3$ connected to the anode, and two switches $S_1$ and $S_2$ connected to the cathode. The anode switch 53 is used to connect the photovoltaic to the anode of a single neighboring photovoltaic, while the cathode switches are used to selectively connect the cathode to the anode of a neighboring photovoltaic, or to the cathode of another neighboring photovoltaic, or to make some combination of these connections.

As the photovoltaics are rearranged from a parallel configuration into a serial configuration, the total current supplied by them will decrease, as will be later explained in more detail. This fact must be taken into account in designing the system. That is, the type and number of photovoltaics should be chosen so that, in their final configuration (e.g., in FIG. 11 in the example above) they produce sufficient current and voltage for the load. Consequently, in their initial configuration, they will be probably supply greater current and voltage than necessary, and some of the energy supplied will be dissipated as heat.

If the load requires a precise voltage, the rearrangement shown in FIGS. 8 to 11 does not necessarily accommodate this requirement. In such a case, a voltage regulator, such as a Zener diode 70 in FIG. 8, can be used to provide the precise voltage. The Zener diode clamps the output voltage at the Zener's breakdown value.

Operating Point of Photodiodes Changes When Reconnected in Series vs. Parallel This discussion will now consider the changes in operating points which the diodes experience as the radiation source decays, and as the diodes are switched into different series-parallel configurations. In brief, it will be shown that, if the diodes are driving a load of constant impedance, then, as the illumination on the diodes decreases, both the current and voltage of the diodes decrease. However, when the diodes are reconnected in series, under the conditions of decreased illumination, the voltage of each decreases, but its current output increases.

This discussion is based on the elementary theory of semiconductor physics. It is possible that behavior of the present invention can deviate from the predictions made by the theory, at least because of the complexity of the interactions involved.

Similar Example: When Batteries are Changed from Parallel to Series, Voltage does not Double Before explaining this phenomenon in detail, a similar change which occurs when common batteries are changed from parallel to series operation will be illustrated. The output voltage does not double. This result is caused by the internal resistance of the batteries. It will be later shown that the photodiodes have an analogous internal resistance.

Figure 17A:
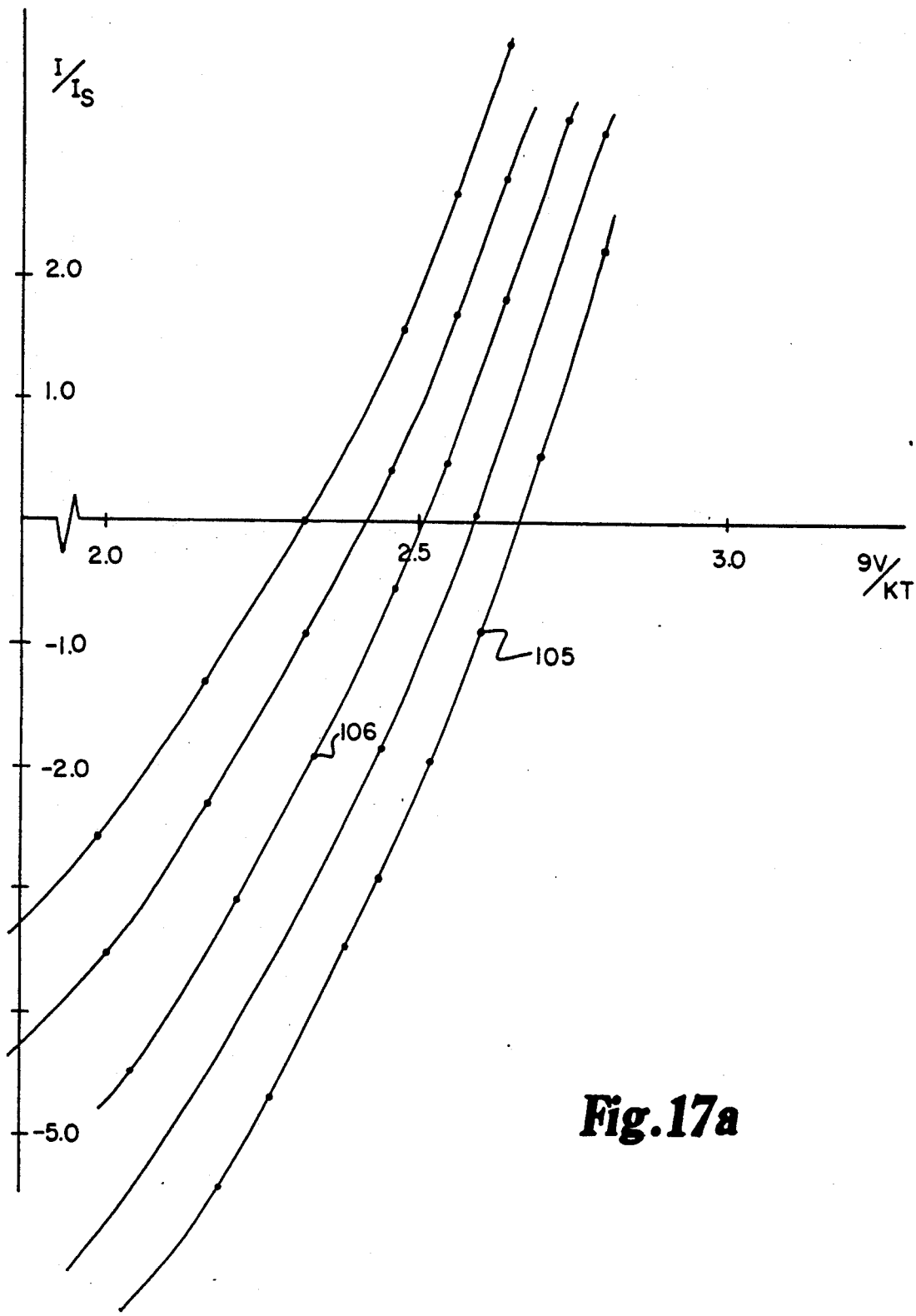
Figure 17:
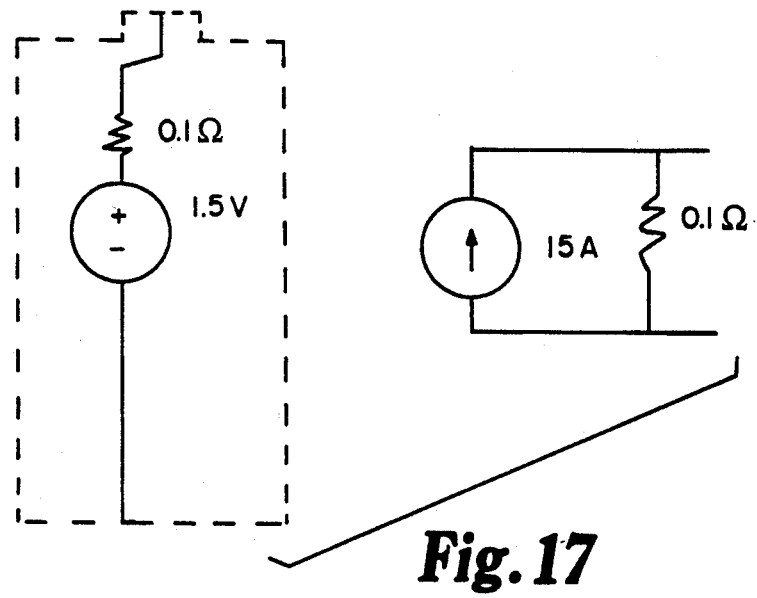
FIG. 17 illustrates a model of a common flashlight battery.

FIG. 17 shows two circuit depictions of a practical battery. One depiction is an ideal voltage source of 1.5 volts in series with a resistance of 0.1 ohm. The other shows the same battery, but modeled as a current source of 15 amps in parallel with a 0.1-ohm resistor. These two depictions are interchangeable.

Figure 18:
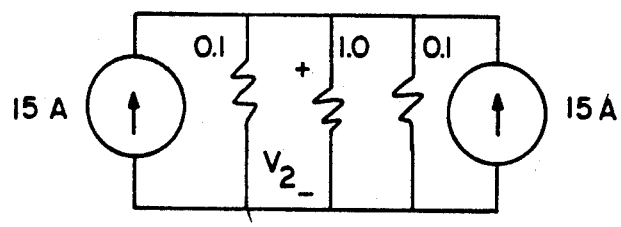
FIG. 18 illustrates two batteries driving a load in parallel.

Two of these batteries are connected in parallel to a 1-ohm load, in FIG. 18. (The current-source model of FIG. 17 is used in order to make the computation simpler.) The three resistors in parallel are equivalent to 0.048 ohms (i.e., $0.048 = 1/[1/0.1 + 1/0.1 + 1/1)]$. The voltage $V_2$ across the load is thus $30 \times 0.048$, or 1.44 volts.

Figure 19:
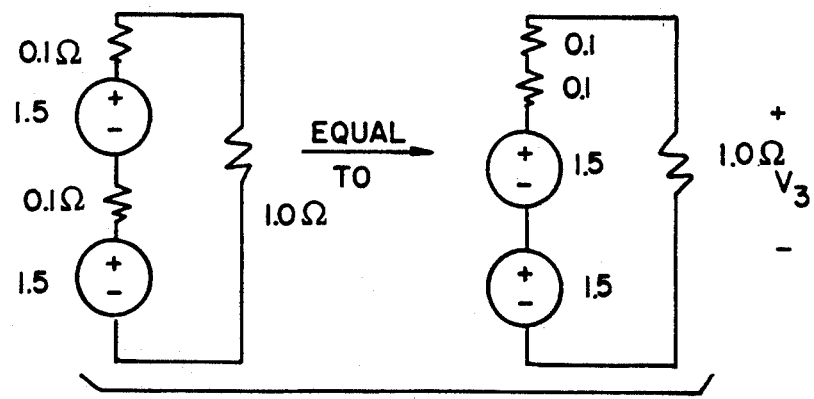
FIG. 19 illustrates two batteries driving a load in series.

If the batteries are now connected in series, as shown in FIG. 19, then the voltage $V_3$ across the load becomes 2.5 volts [i.e., $2.5 = 3 \times (1.0/1.2)$]. Clearly, the voltage across the load in the series case (i.e., 2.5 volts) is not double the voltage of the parallel case (i.e., 1.44 volts). Somewhat similar principles apply to the parallel-series reconfiguration of the photodiodes in the invention, as will now be explained. However, the situation is more complex, because the the internal impedance of the photodiode is neither constant nor linear, but depends on the operating point. Finding, the operating point of a photodiode will now be considered, first in the case of a single diode, and then for series- and parallel combinations.

Operating Point of Photodiode

The classical diode equation is the following:

$I = I_s[\exp(qV/kT) - 1]$ wherein
I is the current through the diode,
$I_s$ is the reverse saturation current,
q is the charge of the electron,
V is the voltage across the diode,
k is Boltzmann's constant ($8.62 \times 10^{-5}$ eV/°K.), and T is temperature Kelvin.

Figure 12:
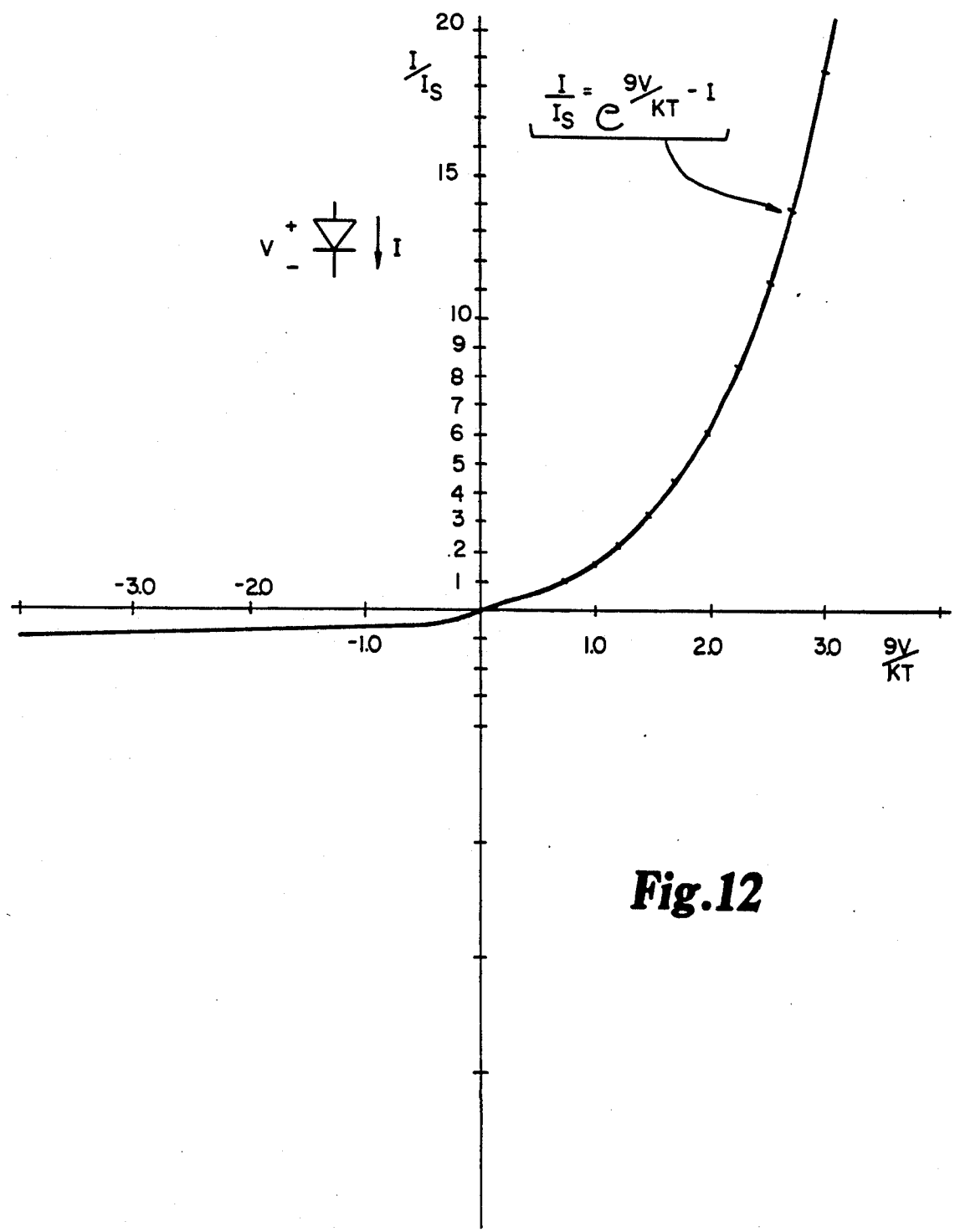
FIG. 12 is a plot of the classical diode equation.

This equation is plotted in FIG. 12. The axes are normalized for simplicity. The customary algebraic conventions are shown in the small diode in the Figure: when a voltage is applied with the polarity shown, a current is driven through the diode in the direction shown, and this current is defined as positive.

For a photodiode under illumination, the equation is the same, except that one term is added, representing the added current due to the optical illumination. The new equation is $$I = I_s[\exp(qV/kT) - 1] - I_{OPTICAL}$$

wherein $I_{OPTICAL}$ is the optically generated current.

Figure 13:
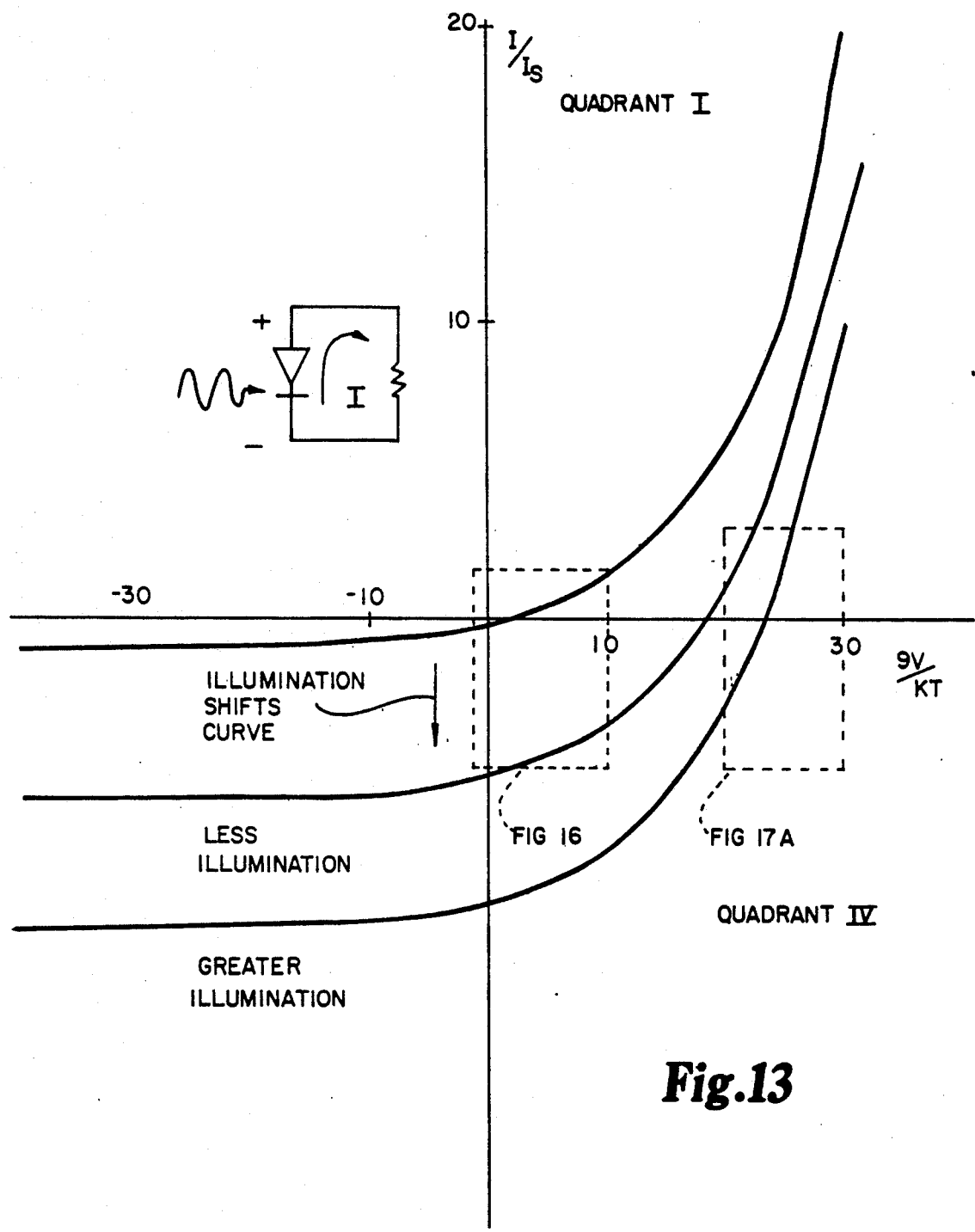
FIG. 13 shows how the plot of FIG. 12 shift when the diode is illuminated.

The latter term has the effect of shifting the plot downward, as shown in FIG. 13. Further, as the optically generated current becomes greater, so does the downward shift, as indicated.

The algebraic conventions for an illuminated diode are shown in the Figure: the illuminated diode produces a current in the direction shown, which is, opposite to the current shown in FIG. 12. That is, the illuminated diode acts like a battery, in the sense that a voltage of the polarity shown is associated with a negative (i.e., outgoing) current.

Figure 14:
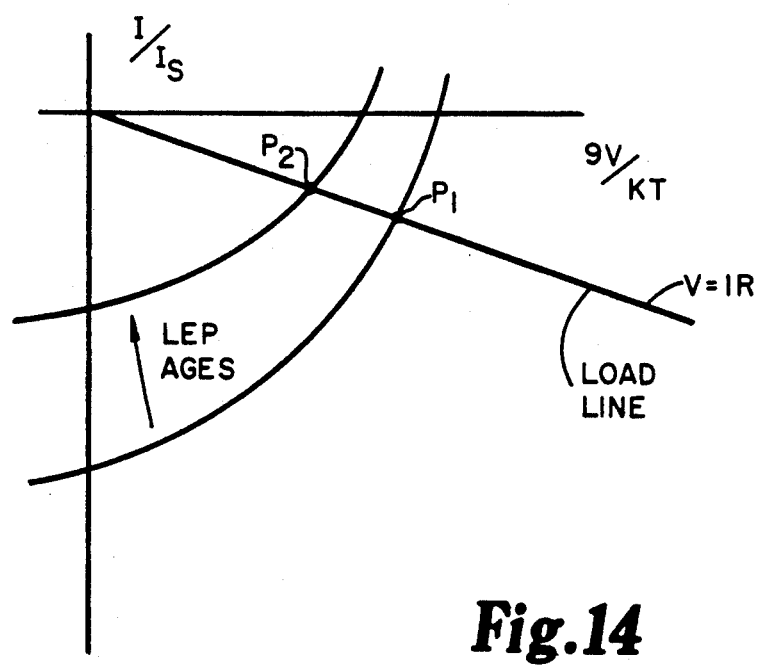
FIG. 14 shows the simultaneous solution of the diode equation and Ohm's law by graphical means.

When the photodiode is used to deliver power to a resistive load, as shown in quadrant II of FIG. 13, the operating point of the photodiode will be in the fourth (IV) quadrant of the x-y coordinate system. The exact operating point within quadrant IV (i.e. the voltage and current at which the diode is operating) can be found by solving two simultaneous equations, namely, the photodiode equation given above and Ohm's law (V=IR). It is perhaps simpler to solve the equations graphically, rather than algebraically, by plotting them both on the same graph and finding the intersection point. This type of solution is shown in FIG. 14, and the operating point is point $P_1$. It will be shown later that the source impedence of the diode is the inverse of the slope of the diode curve at $P_1$. Clearly, unlike the batteries shown in FIG. 17, the diode's source impedence will change as the operating point $P_1$ moves.

When LEP Ages, Operating Point Shifts

When the LEP ages, causing production of Beta-radiation to diminish, the phosphor produces less light, reducing the term $I_{OPTICAL}$ in the diode equation, causing the plot of the diode equation to move upward, as in FIG. 14. However, the line representing Ohm's Law remains unchanged. (This line is also called the load line.) Now, the intersection point moves upward and to the left, to $P_2$: the diode now operates at a lower current and voltage.

To compensate for this drop in voltage, the series-parallel arrangement of the diodes is changed, as described above. This change causes another shift in the operating point of the diode, which will now be analyzed. In brief, it will be shown that, in each diode, the current increases while the voltage decreases.

Figure 15:
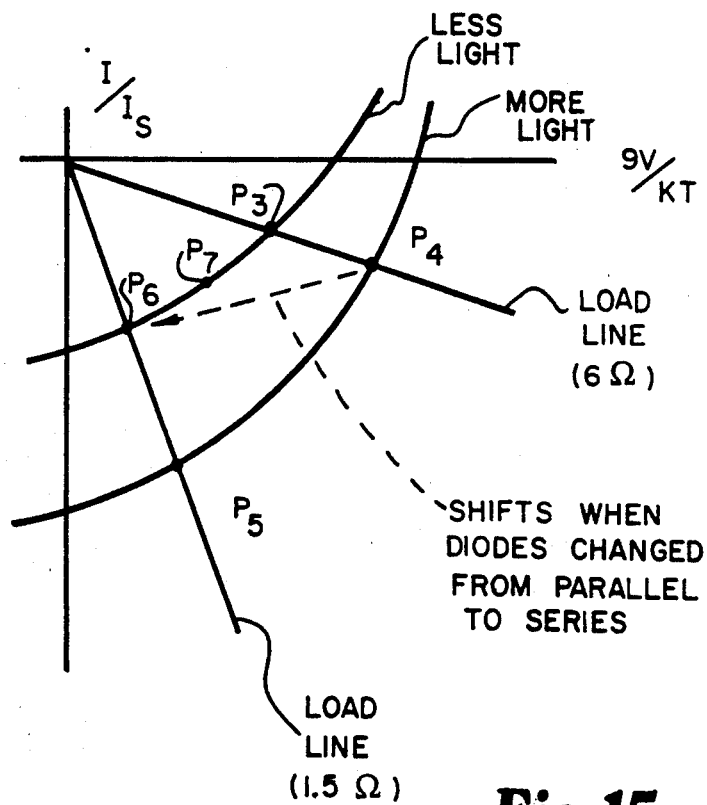
FIG. 15 shows how the operating points of the photodiodes in the present invention move when (a) light intensity diminishes and (b) the photodiodes are changed from a parallel to a series configuration.

Two parallel photodiodes are shown in FIG. 20, supplying a load. In order to find the voltage across the diodes, one may simplify the situation as follows. Assume that the load impedance is 3 ohms. This impedance is equivalent to two impedances of 6 ohms, connected in parallel, as shown in FIG. 21. Insofar as each diode is concerned, FIG. 21 may be split, as shown in FIG. 22. Finding the operating point is done the same way as done previously in connection with FIG. 15, and FIG. 23 shows the operating point $P_4$.

If the diodes are re-connected in series (as happens in FIGS. 3-5), but still driving the same 3-ohm load, as shown in FIG. 24, inquiry is again made as to the operating point. For the analysis, the circuit can be re-drawn as in FIG. 25, wherein the load resistance has been re-drawn as two resistances $R_2$ and $R_3$ which have the same total series resistance. For purposes of finding the operating point, each diode can be viewed as connected as shown in FIG. 26: an imaginary conductor is added between nodes 90. One justification for this connection is that, since it is assumed that the diodes are identical, as are the resistors, then nodes 90 are at identical voltages. In such a case, these nodes can be connected by a perfect conductor, with no change imposed on the circuit. Now, for present purposes, the diode is treated as though connected as shown in FIG. 26.

Another justification is the intuitive recognition that the voltage drop across each diode is the same as that across each resistor, and that the current through each diode is the same as that through each resistor. Consequently, the diode behaves as though it were connected in parallel with one of the resistors, as shown in FIG. 26.

The operating point may be found graphically, as above, except that a different load line is used, because the resistor in FIG. 26 (corresponding to the series case) is smaller in value than the resistor in FIG. 22 (corresponding to the parallel case). The operating point is $P_5$ in FIG. 23.

Summary of Parallel-Series Change of Diodes

Therefore, to summarize, when two photodiodes are operating in parallel and driving a 3-ohm load, each diode can be analyzed as though driving a single 6-ohm load. The operating point is found from the intersection between the appropriate diode curve and the 6-ohm load line; the point is $P_4$ in FIG. 23. Then, if the illumination remains the same, but the diodes are connected in series to the same 3-ohm load, each diode can be analyzed as though driving a 1.5 ohm load. The operating point is now found from the intersection of the diode curve with the 1.5-ohm load line. The operating point moves from point $P_4$ to point $P_5$ in FIG. 23.

Change in Illumination is Added to Analysis

When the illumination diminishes, as happens when the intensity of Beta-radiation drops, and if the photodiodes are reconfigured from a parallel to a series connection, the same analytical procedure is taken as above, except that, in addition, the shifted diode curve is used. This shift is shown in FIG. 15.

Therefore, the invention can be viewed as follows. Operation begins with two diodes in parallel, driving a 3-ohm load. The operating point is at $P_4$ in FIG. 15. As time passes, the diode curve shifts upward, to the curve labeled "less light." Now, the operating point is at $P_3$. Voltage and current are reduced. To compensate for the reduced voltage, the diodes are switched into a series configuration, as in FIG. 24. Now, the effective load seen by each diode changes to a 1.5-ohm resistor. The operating point is now found from the intersection of the shifted diode curve and the 1.5-ohm load line. The operating point is $P_6$ in FIG. 15. The voltage has dropped (for each diode) and the current has increased, compared to point $P_3$. However, since the diodes are now connected in series, the total voltage is greater.

The reconfiguration has raised the output voltage, despite the drop in luminence of the LEP.

MAXIMUM POWER TRANSFER

Figure 27:
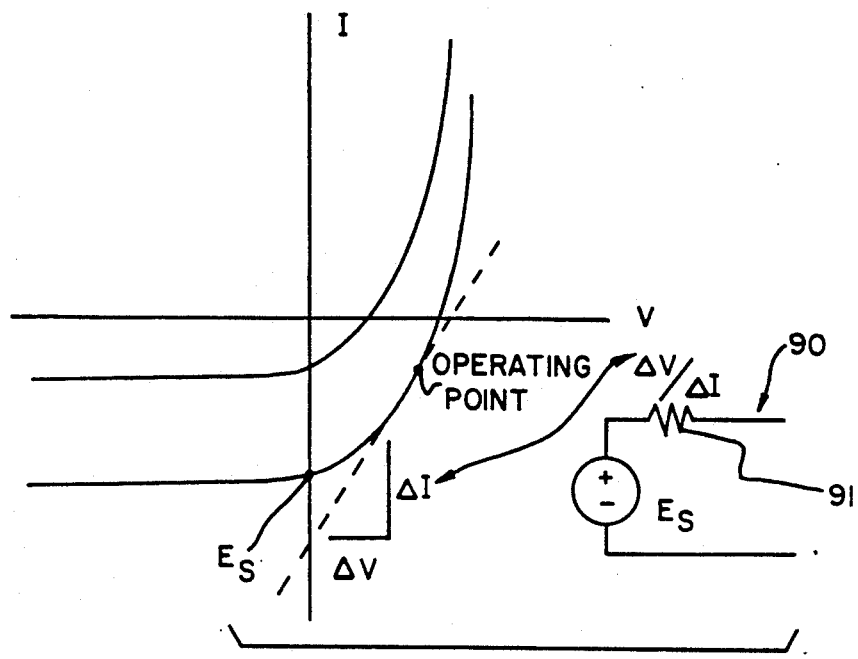
FIG. 27 illustrates a model of a photodiode.

For maximum power transfer from the diode to the load, the source impedance must equal the load impedance. The source impedance 91 of the diode is shown in FIG. 27, and corresponds in function to the 0.1-ohm resistor 82 in FIG. 17.

The source impedance is not constant, but changes as the operating point changes. That is, in FIG. 27, a model of a diode is shown. The model consists of a voltage source $E_s$ in series with a resistor 91. The value of $E_s$ is equal to the intercept of the diode curve with the vertical axis, as indicated, and will change as illumination changes. The value of resistor 91 (i.e., the source impedence) is the inverse of the slope of the diode curve at the operating point, and will change as the operating point changes, because the diode curve is not a straight line. The fact that the source impedance changes means that it cannot always match the load impedance, and thus maximum power transfer will not always occur.

Figure 16:
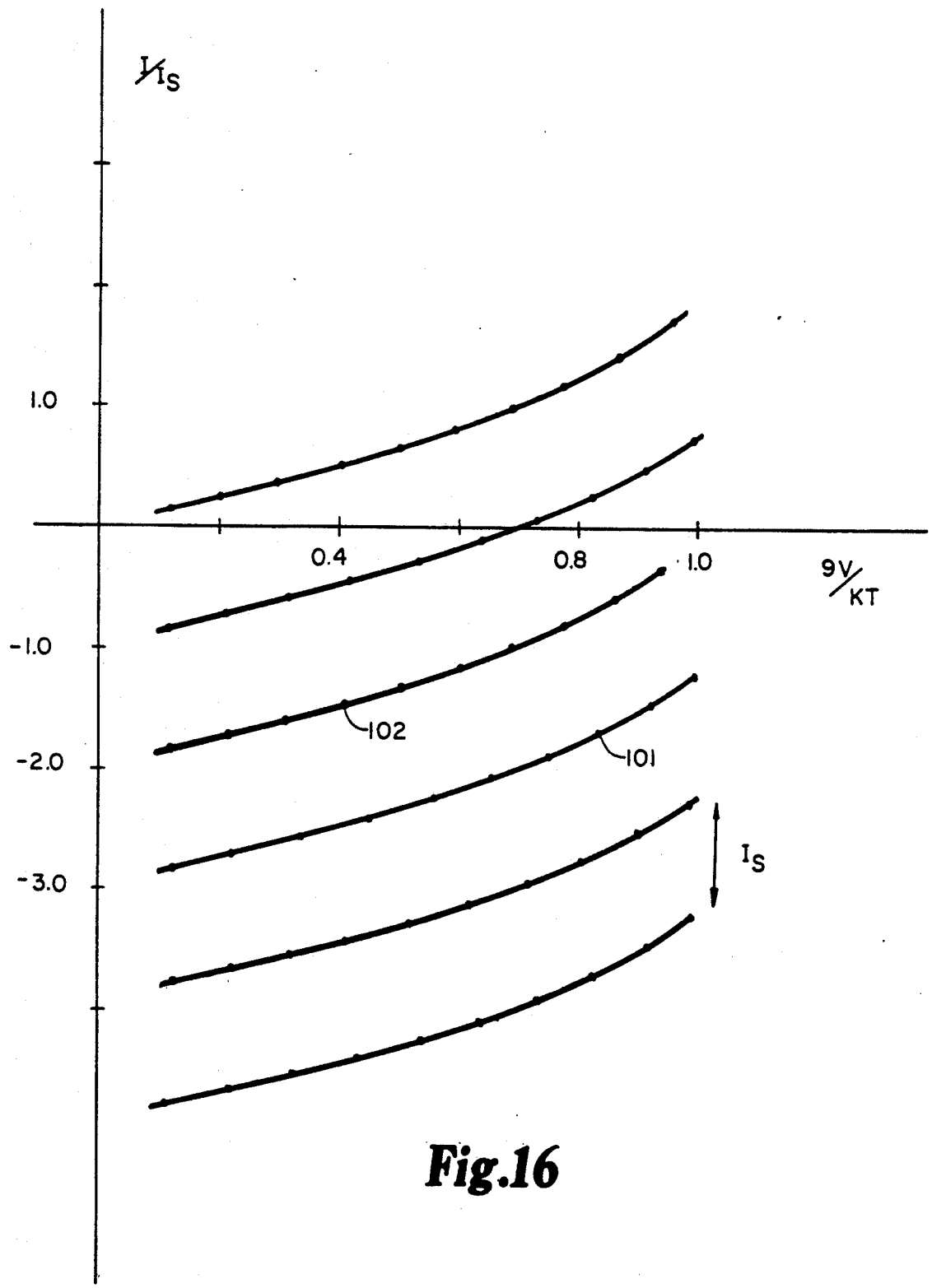
FIGS. 16 and 17A are enlarged views of regions so designated in FIG. 13.

The invention presents three possible solutions to this problem. One is to keep the operating point at points of similar slope on the diode curve. That is, FIGS. 16 and 17A are enlargements of two regions in FIG. 13. It may be possible, in some cases, to arrange the load impedance such that the shift from $P_4$ to $P_6$ in FIG. 15 amounts to either a shift from point 101 to 102 in FIG. 16 or from point 105 to 106 in FIG. 17A. With such a shift, the change in source impedance is small or nonexistent, because the change in slope is small or nonexistent. However, if the shift is from point 101 in FIG. 16 to point 106 in FIG. 17, the change in source impedance will be larger.

A second approach is to adjust the load to accommodate the different source impedance. That is, maximum power is delivered by the diode when the product IV (i.e., current multiplied by voltage) is maximum. This maximum point will probably be near point $P_7$ in FIG. 15, and need not coincide with an intersection point (such as $P_4$) with the load line in FIG. 15. The control system 59 in FIG. 6 can control switches 110 which interpose an additional load 112 on the photodiodes. The additional load will change the load line in FIG. 15, and can bring the intersection point to the maximum IV point. The additional load can be connected either in parallel or in series. Alternately, part of the existing load can be shed, in order to change the slope of the load line.

Viewed another way, the final load can be selected to match the source impedence existing when the operating point is at point $P_6$. When the operating point was previously at point $P_4$, the slope of the diode curve was greater, and the source impedance was lesser. For maximum power transfer to have occured at $P_4$, the load should have been reduced, as by adding a resistive load in parallel.

These load changes can be useful when the system powered by the invention is located in a remote environment, such as in a satellite or under water. It is possible that some task can be required of the system, such as telemetry, and that this task only needs power after some other task has already been accomplished, such as data collection. In this case, the "telemetry load" is added to the normal load, with the result that greater power is obtained from the photovoltaics, because of impedence-matching.

As a third approach, it can be preferable to design the system such that the maximum power transfer occurs after the voltage has already drooped, rather than during initial operation. That is, the load is designed to match the source impedance at $P_6$ in FIG. 15, and the mismatch at $P_4$ is ignored. The reason is that excess power is available during initial operation, but becomes more scarce when the phosphors become less radiant. It is thus more important to maximize power when less photon energy is available.

INVENTION CAN PRODUCE A.C.

Figure 28:
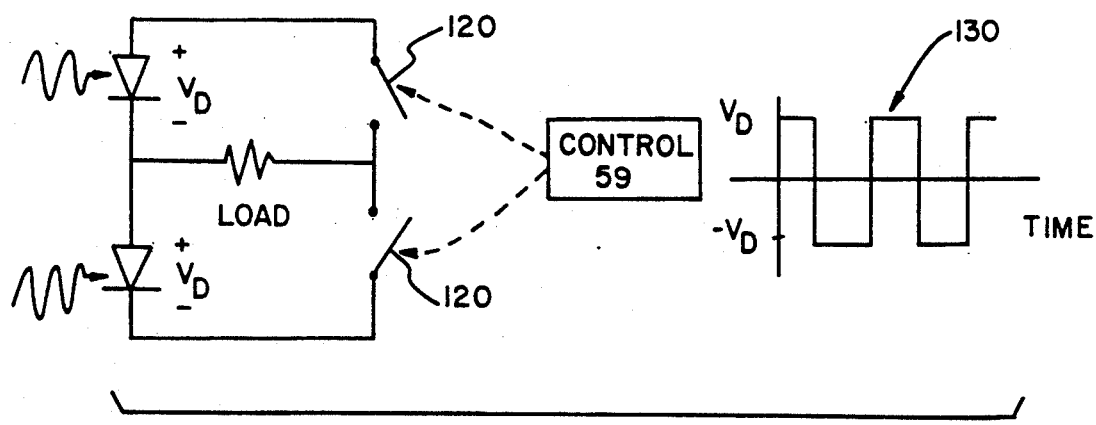
FIG. 28 illustrates a system for obtaining alternating current using the invention.

The system can produce ac. FIG. 28 shows one approach, wherein the photodiodes are arranged in opposite polarity when connected across a load resistor by switches 120. The control 59 alternately closes the switches 120, creating the square wave 130.

As discussed above, the voltage of the photodiodes can droop as time progresses. The approaches discussed above can be taken in order to maintain voltage at a minimum level, while providing the alternating current. For example, the diodes shown in FIG. 29 would be replaced by the array shown in FIG. 6.

The sequence of voltages discussed in connection with FIG. 6 was 1, 2, 3, and 6 volts. However, voltage increments of a single diode voltage drop (i.e., nominally 0.1–0.5 volts) can be obtained by closing the switches such that a single diode (or a group of parallel diodes) is added, one at a time. For example, switches can be arranged which first apply the diodes in group 130 in FIG. 7 in parallel to a load. Then, group 140 (themselves in parallel) are added in series to group 130. Next, group 140 (themselves in parallel) is added in series. In this way, the control 59 in FIG. 6 increases the voltage in uniform increments.

Adding particular voltage increments at specified times can create sinusoidal current. For example, applying the voltages indicated in FIG. 29, at the times indicated, will produce a 60-Hz sine wave, with two volts peak-to-peak.

ALTERNATE EMBODIMENTS

Diodes Need not be Identical

It is not required that the diodes be identical. For example, silicon, germanium, and gallium arsenide all produce different open-circuit output voltages under identical illuminations.

Control can Reconfigure in Response to Load Behavior Or Based on Lapse of Time The control 59 in FIG. 6 can order a reconfiguration of the diodes, or reconfiguration of the load as shown in FIG. 6, in response to measured voltage (or current) of the load. A sensor 150 measures the load voltage. However, since the decay of the tritium is a known function of time, which does not depend on power drawn by the load, the control 59 can order a reconfiguration based on elapsed time. That is, the time-behavior of the photodiode's output voltage is known in advance, based on the known decay rate of the radioisotope, and can be stored in the control's memory. This feature distinguishes the invention from chemical batteries, whose decay rate depends on amount of usage, as well as the passage of time.

Illumination Intensity of Photodiodes can be Controlled

Figure 30:
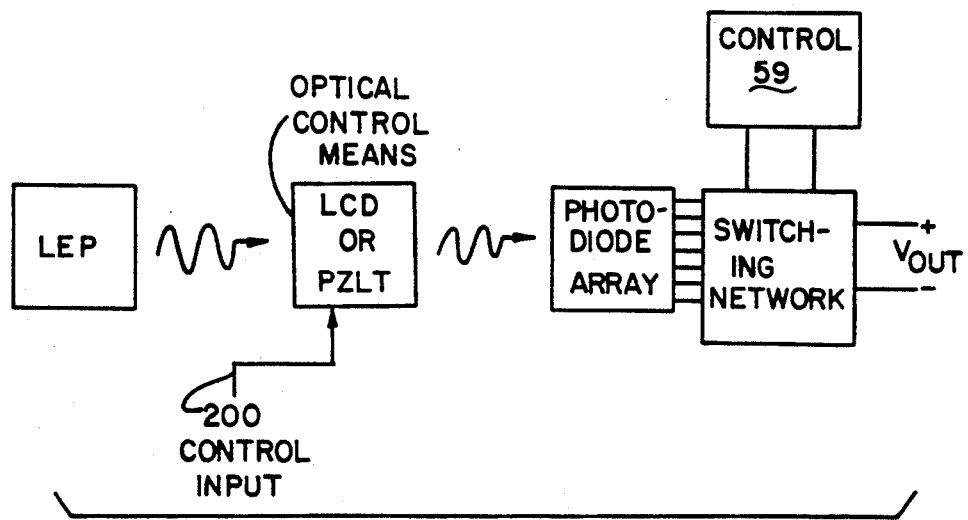
FIGS. 30 and 31 illustrate other embodiments of the invention.

In FIG. 30, an optical control means is added, which can take the form of a Liquid Crystal Display (LCD), a Lead Lantium Zirconium Titanate (PLZT) crystal, or other apparatus which attenuates light a by a selected amount in response to an electrical input signal 200. The output voltage $V_{OUT}$ depends on the amount of attenuation imposed by the optical control means, as well as the series-parallel configuration of the photovoltaics set by the control 59.

Since it is known that the PLZT can be switched in the Gigahertz range, the invention can be used as a self-powered radio-frequency oscillator.

Cold Temperatures Improve Performance

As discussed in the referenced application entitled CRYOGENIC ELECTRICAL ENERGY SOURCE, the Inventors have found that the light output of the LEP increases significantly at liquid nitrogen temperatures, causing an increase in electrical output of the photovoltaics. Accordingly, any of the embodiments discussed herein can be operated at such temperatures. Further, it has been found that an increase in LEP brightness also occurs at the temperature of the fog which exists in a Dewar flask containing liquid nitrogen. The fog temperature is minus 80 degrees C. Any of the embodiments can be operated at this temperature as well.

Figure 31:
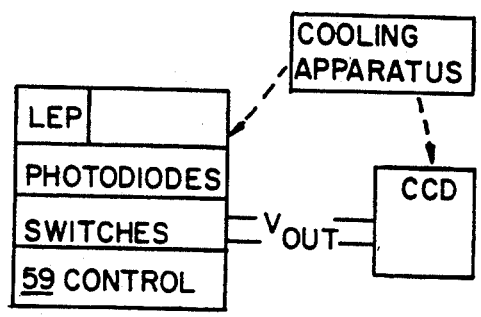

Low-temperature operation can allow the invention to act as a power supply for a charge-coupled optical imaging device (CCDs), such as those used in weather observation satellites. The CCDs are already associated with equipment to maintain low temperatures, because the CCDs are operated at low temperatures in order to increase their switching speeds. Thus, no significant additional cooling equipment is required for the invention. CCDs are commercially available from Rockwell International or Hughes Aircraft Corporations. A diagram of such a system is shown in FIG. 31.

Other Light Sources Possible

It is not necessary to power the photovoltaics using the LEP. Other light sources are possible to use, such as sunlight, chemically luminescent cells, artificial light sources (such as a flashlight), or ambient room light.

Invention can be Viewed as Waveform Generator

Figure 29:
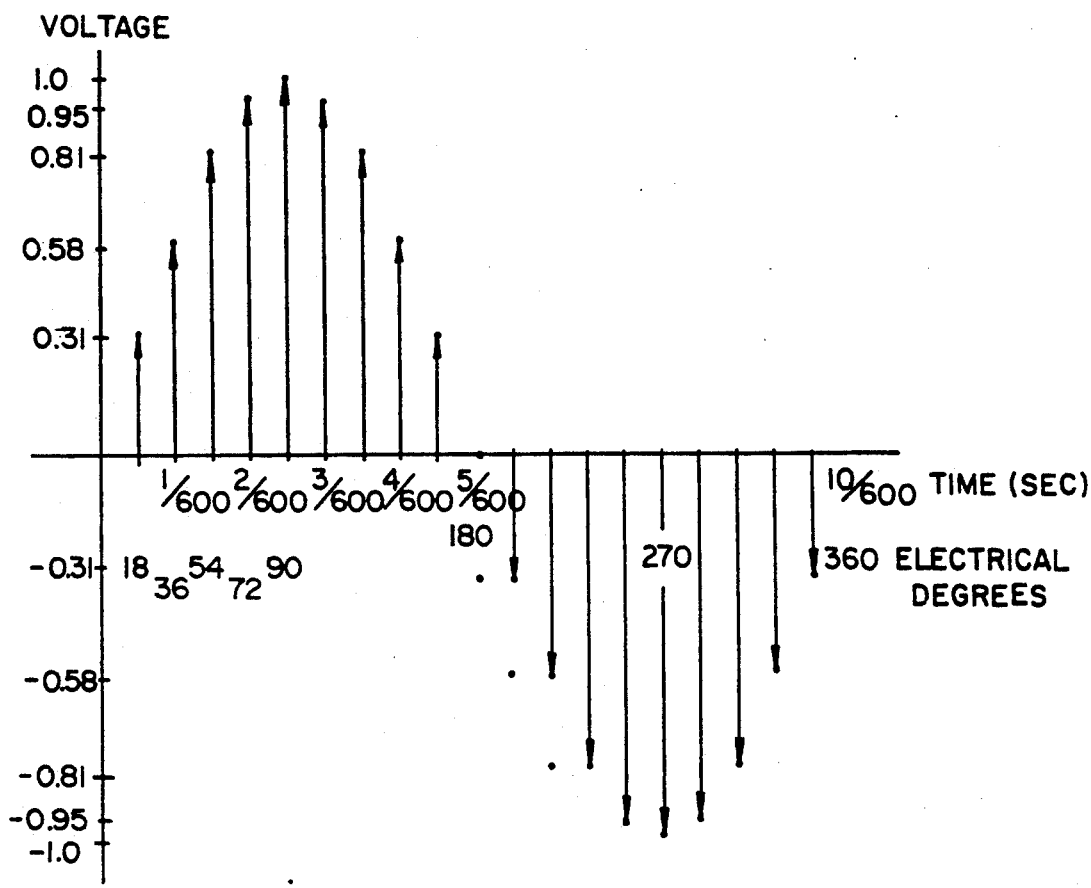
FIG. 29 illustrates a sequence of voltages which the invention can supply, in order to produce a 60Hz power source.
Figure 32:
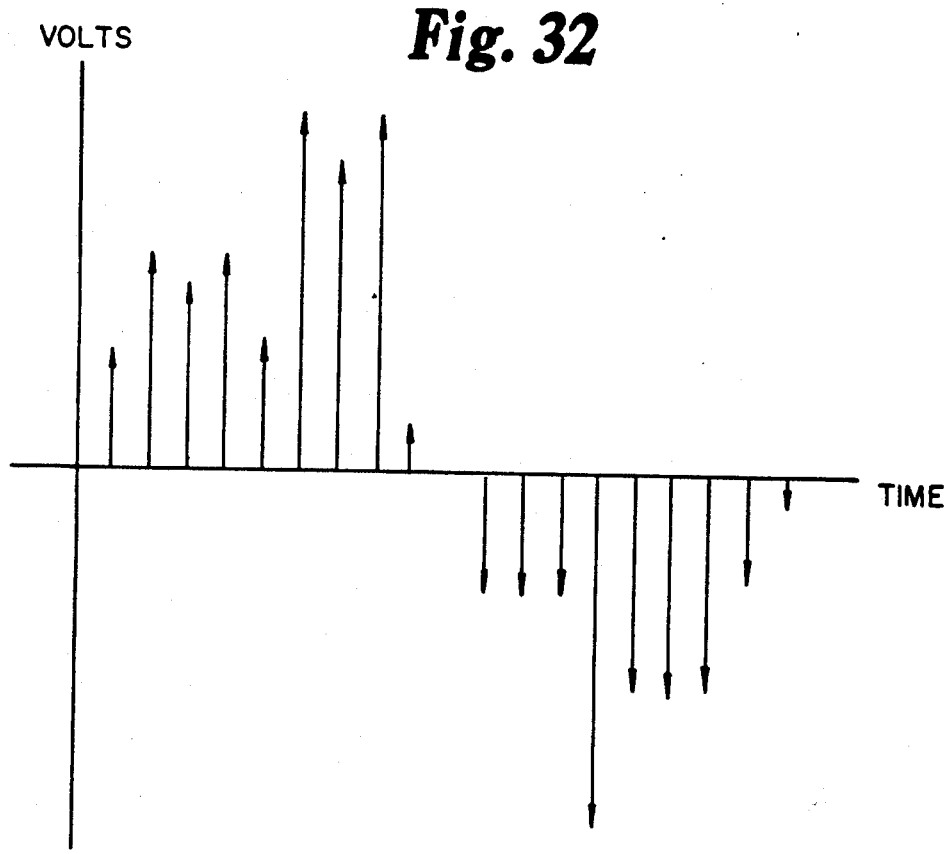
FIG. 32 illustrates a waveform which can be provided by the invention.

FIG. 29 shows a sine wave produced by the invention. However, the waveform can be any arbitrary shape, and need not be repeating. That is, the voltage provided at any given time depends on the series-parallel connection of the photovoltaics. The speed with which the connections can be made depends on the speed limits of the FETs 58 in FIG. 6, and the control system 59. Thus, the arbitrary waveform shown in FIG. 32 can be generated by the invention, and the shape of the waveform can be changed as fast as the switching equipment will allow. The fact that the voltage of each diode changes as the operating point changes can be accommodated by placing a voltage regulator, such as a zener diode 133 in FIG. 6, in parallel with each photovoltaic. Now, each photovoltaic can be treated as a constant-voltage source. It is noted that zener diodes provide their voltage-limiting function when reverse-biased.

TECHNICAL ADDENDUM

Summary

An electrical energy source is created by the combination of (a) a light emitting polymer having at least one surface emitting light energy and (b) a photovoltaic cell having a light collecting surface and a pair of electrical contacts. The light collecting surface of the photovoltaic cell is optically coupled with the light emitting surface of the polymer. An open-circuit voltage is generated between the pair of electrical contacts as a result of the absorption of emitted light energy from the light emitting polymer material by the photovoltaic cell.

The light emitting polymer is a tritiated organic polymer to which at least one organic phosphor or scintillant is bonded. Maximum absorption of the emitted light energy is achieved by (a) an intimate optical contact between the light emitting surface and the light collecting surface, (b) matching the maximum absorption frequency bandwidth of the photovoltaic cell with the specified frequency bandwidth of the emitted light energy from the light emitting polymer material, and (c) the structural arrangement of the light emitting polymer material itself. To maximize the surface area between the light emitting polymer and the photovoltaic cell, the light emitting surface and the light collecting surface are preferably arranged so that they are generally parallel to and in intimate contact with each other. In addition, the light emitting polymer material and the photovoltaic cell may be arranged to allow the photovoltaic cell to be constructed in manner so as to absorb light energy at more than a single surface.

In another embodiment, the light emitting polymer material is optically separated from the photovoltaic cell by an optical control means for controlling the amount of light that may pass through the optical control means to be absorbed by the photovoltaic cell. The optical control means may be a liquid crystal display (LCD) or lead lantium zirconium titinate (PZLT) or similar material that is either transparent or opaque, depending upon the voltage or current applied to the material. By controlling the amount of light that may be absorbed by the photovoltaic cell, the optical contol means also controls the output of the photovoltaic cell and, hence, operates as either a voltage or current regulator, depending upon the particular circuit that utilizes the electrical energy source of the present invention. The optical control means allows the electrical energy source of the present invention to simulate an alternating current source from a direct current source without the need for electrical circuitry external to the electrical energy source.

The present invention provides a novel radioisotope-activated, electrical energy source that exhibits several desirable characteristics. Foremost, the electrical energy source of the present invention is relatively safe and is, thus, viable for general commercial use when the quantities of radioactivity are generally below 100 curies. The low emissivity and high energy density of the preferred embodiment utilizing a tritiated organic polymer to which an organic phosphor or scintillant is bonded enable the electrical energy source to realistically utilize 4.0% or more of the theoretical 3.6 amp-hours of electrical energy that are present in each curie of tritium. In this embodiment, an electrical energy source having 100 curies of tritium is capable of providing 1 microwatt of power at 1 volt and 1 microamp for the entire lifetime of the electrical energy source, approximately 20 years.

Because the electrical energy generated is dependent upon the rate of emission of photons from the light emitting polymer (which is in turn dependent upon the rate of beta-emissions from the radioisotope used to activate the light emitting polymer), the amount of energy available is constant and determinable. In addition to providing a unique source of electrical energy for CMOS, NMOS and other low power types of electronic circuitry, the output stability of the electrical energy source of the present invention makes it ideally suited for applications that require a very constant source of power and ensure that it is not drained of its energy if subjected to a short-circuit. Moreover, the materials and packaging can be selected to enable the electrical energy source to operate in a cryogenic environment without significant degradation of the power compared to conventional chemical batteries, because the rate of conversion of the photons by the photovoltaic cell is positively affected by decreasing temperature.

Referring now to FIG. 1, a cut-away pictorial representation of the preferred embodiment of the present invention is shown. The electrical energy source 10 is comprised of a planar sheet of light emitting polymer ("LEP") material 12 that is interposed between a pair of photovoltaic cells 14 and 16 having planar dimensions similar to the LEP material 12. The photovoltaic cells 14 and 16 and the LEP material 12 are encased in a sealed case 18, preferably a laser-welded, stainless steel case, having a pair of electrical contacts 20 and 22 exposed on one end of the case 18. The contacts 20 and 22 are disposed in a pair of ceramic insulators 24 and 26 and are connected to the photovoltaic cells 14 and 16 in such a manner that one of the contacts will provide a positive voltage potential and the other contact will provide a negative voltage potential.

In the preferred embodiment, the LEP material 12 is a tritiated organic polymer to which an organic phosphor or scintillant is bonded. Such an LEP material was obtained from Amersham International plc, Amersham Place, Little Chalfont, Buckinghamshire, England, and, pending NRC regulatory approval, may be available from Amersham International plc. Such an LEP material is described in the United Kingdom patent application, Ser. No. 890,5297.1 by Colin D. Bell, entitled TRITIATED LIGHT EMITTING POLYMER COMPOSITION, filed in the British Patent Office on Mar. 8, 1989, the disclosure of which is hereby incorporated by reference herein. It should be recognized that other types of LEP material known in the prior art may also be utilized with the present invention. (e.g., U.S. Pat. Nos. 3,033,797, 3,325,420 and 3,342,743). Those aspects of the LEP material 12 that allow it to be used effectively in the present invention are discussed below in connection with the various design considerations set forth above.

In the preferred embodiment, the photovoltaic cells 14 and 16 are amorphous thin-film silicon solar cells, Model No. 035-01581-01, available from ARCO Solar, Inc., Chatsworth, Calif., or their equivalent. These cells have their highest efficiency conversion (greater than 20%) in the blue range of the spectrum of visible light to match the frequency bandwidth of the emitted light of LEP material incorporating a phosphor that emits in the blue range. While the particular photovoltaic cells 14 and 16 in the preferred embodiment have been selected to match the blue range of the spectrum of visible light, it should be apparent that other photovoltaic cells may be selected to match the bandwidth of light emitted at other frequencies. In particular, as discussed below, it is known that a new solar cell, known as the Sunceram II (trademark), available from Panasonic's Industrial Battery Sales Div., is claimed to more efficient than conventional amorphous silicon solar cells, especially in the red range of the spectrum of visible light.

To maximize the optical transfer between the LEP material 12 and the photovoltaic cells 14 and 16, the surfaces of the photovoltaic cells 14 and 16 not in contact with the LEP material 12 are coated with a reflective material, preferably an aluminum paint or equivalent. The edges of the LEP material 12 not in contact with the photovoltaic cells 14 and 16 are clad with a similar reflective material. The surfaces of the LEP material 12 and the photovoltaic cells 14 and 16 that abut one another are coated with a contact gel, Rheogel 210C, available from Synthetic Technology Corp., McLain, Va., or its equivalent, as a means for optically coupling the surfaces to increase the amount of light that is transmitted from the LEP material 12 to the photovoltaic cells 14 and 16.

Selection of the Radioisotope

The radioisotope that is used in the LEP material 12 must produce sufficient scintillations in the LEP material to insure an adequate production of light for absorption by the photovoltaic cells 14 and 16. For safety purposes, it is desirable that the selected radioisotope be chemically bonded to the polymer. By chemically bonding the radiosotope to the polymer, any undesirable build-up of the radioisotope is prevented and the concentration levels of the radioisotope will remain constant no matter what environmental factors the LEP material 12 is subjected to. Unlike radioisotopes in a liquid or gaseous state, the bonding of the radioisotope to the polymer in the LEP material 12 of the present invention prevents the free release of radiation if the material or container is ever broken. The bonding of the radioisotope to the organic polymer is expected to result in NRC approval for the use of higher allowable levels of radioactive material for radioisotopes in this format.

The radioisotope should have a half-life comparable to the desired useful lifetime of the electrical energy source 10. Because the power is directly proportional to the rate of decay of the radioisotope in the LEP material 12, for a given desired power output the rate of decay should ideally correspond to the power requirements of the electrical energy source 10. If the half-life is too long with respect to the useful life of the electrical energy source 10, then the amount of radioisotope required to produce the same rate of decay is increased, thus presenting increased safety and shielding problems. If the half-life is too short with respect to the useful life of the electrical energy source 10, then the amount of radioisotope required to produce the desired rate of decay at the end of the useful life of the electrical energy source requires that the LEP material 12 be overloaded initially, thus generating wasted energy at the beginning of the life of the device. Obviously, if a decaying power source is desired or acceptable this consideration is not important.

To minimize the radiation hazards associated with use of a radioisotope, the radiation emitted by the selected radioisotope should not be very penetrating.

Preferably, a high percentage of the radiation emitted by the radioisotope should be absorbed by the photovoltaic cells 14 and 16 or by the sealed case 18. Therefore, radioisotopes emitting gamma radiation or high-energy x-rays are not preferred; beta radiation emitters are preferred. In addition, the radioisotope must be selected so that it may be chemically bonded to the organic polymer to achieve the desired solid, captured state for the LEP material 12. A further consideration in selecting the radioisotope is the economic cost of the radioisotope. The cost of producing various radioisotopes varies by orders of magnitude. For example, the cost per curie of $^{14}C$ is more than two orders of magnitude greater than for $^3H$.

Table I provides data on several radioisotopes, among others, that may be used.

TABLE I

| Radioisotope | $^3H$ | $^{14}C$ | $^{10}Be$ | $^{32}Si$ | $^{32}P$ |
|---|---|---|---|---|---|
| Half-life (years) | 12.3 | 5730 | $2.7 \times 10^6$ | 650 | .039 |
| Max. beta Energy (MeV) | .0186 | .156 | .555 | .22 | 1.71 |
| Ave. beta Energy (MeV) | .0056 | .049 | .194 | .065 | .68 |
| Mass of 1 curie (grams) | $1.0 \times 10^{-4}$ | .22 | 75 | .058 | NA |
| Absorber to stop betas (mg/cm$^2$) | .72 | 24 | 180 | 30 | 790 |
| Power Density (mW/g) | 320 | 1.3 | .015 | | 76 |

For the safety reasons mentioned above, beta-active radioisotopes are especially preferred. The decay of beta-active isotopes results in a continuum of beta energies being emitted from the radioisotope. This continuum extends from zero up to a maximum value as shown in Table I. The average beta energy is computed using the equation:

$$<E> = 0.099E(1 - Z^{0.5})(3 + E^{0.6})$$

where $<E>$ is the average energy in MeV, E is the maximum energy in MeV, and Z is the atomic number of the daughter nucleus that results after the decay. The first three radioisotopes in Table I decay to stable elements, but $^{32}Si$ decays to $^{32}P$, which in turn decays to stable sulphur. Therefore, the decay for each $^{32}Si$ atom produces the combined beta energy of the decay of both the silicon and the phosphorous.

One curie is defined to be $3.7 \times 10^{10}$ decays/second. The mass of the radioisotope required to produce this activity is obtained from the following equation:

$$m = 2.8 \times 10^{-6} (T_{\frac{1}{2}}) M$$

where $T_{\frac{1}{2}}$ is the half-life of the radioisotope expressed in years and M is the atomic mass.

Because the radioisotope is an internal component of the polymer, a given thickness of shielding must be provided around the radioisotope-activated polymer to completely absorb all of the beta radiation. The following range relation was used to compute the required absorber thickness in Table I:

$$R = (540E - 130(1 - e^{-4E}))$$

where R is in mg/cm$^2$ and E, the maximum beta energy, is in MeV. In order to obtain the linear thickness required by the absorber to shield all beta radiation, one would divide R by the density of the absorber. For example, if a polymer of 2 g/cm$^3$ is used as the absorber surrounding the LEP material 12, then the required thickness for $^3H$ would be 0.0036 mm.

Based upon the considerations set forth above and especially for safety reasons, the preferred radioisotope for the present invention is tritium. With a half-life of 12.36 years and a beta decay with an 0.0186 MeV maximum energy, tritium has been considered one of the most innocuous of fission produced radioisotopes. Because of the low energy and penetration power of the beta particle associated with its decay, tritium does not pose a significant external radiation hazard. The beta particles emitted by tritium are not even capable of penetrating the epidermis. In addition, the chemical bonding of the tritium in the solid polymer form prevents escape of the tritium in its gaseous state, thereby decreasing the chance that tritium may be absorbed into the body by skin penetration in the form of a gas or vapor.

Another method to compare the various radioisotopes is to compare their relative power densities, the decay power produced per gram of material. With the greatest power density/gram and the least amount of absorbent material necessary to stop all beta particles from being emitted, tritium is the best choice for an electrical energy source that provides a low power, long-life electrical energy source when the requirements of a single electrical energy source are less than 5 to 10 milliwatts-hours for the desired lifetime of the electrical energy source, approximately 20 years or less.

It will be seen that if a higher power output or longer lifetime of the electrical energy source is required, other radioisotopes may be utilized in the light emitting polymer, depending upon the environmental and safety considerations involved. The next most favorable radioisotope may be the $^{32}Si$ and $^{32}P$ combination, although the shielding requirements for this radioisotope would be significantly increased. Because silicon is similar to carbon, it should be readily incorporated into the polymer. Although $^{14}C$ also appears to be a good candidate for use as the radioisotope, it should be recognized that the long half-life will require about 250 times as much $^{14}C$ in the polymer as compared to $^3H$ to produce the same power. For example, in a military or space application, $^{14}C$ or the $^{32}Si$ and $^{32}P$ combination may be preferred because of the higher energy of the beta particles and because of the significantly longer half-life, provided that adequate shielding can be incorporated into the packaging of the electrical energy source to compensate for the higher energy radiation and the increased curie level required by the longer half-life radioisotopes.

Scintillation Efficiencies

As a beta particle generated by the selected radioisotope moves through the organic polymer, energy is released by several mechanisms: (a) excitation of pi-electrons to excited states, (b) pi-electron ionization, (c) excitation of other electrons to excited states, and (d) ionization of other electrons. All but the first of these mechanisms ultimately only result in an increased thermal energy within the LEP material 12. Only the first results in scintillation, the release of a photon from the organic phosphor or scintillant upon decay from the excited state. For many organic materials, this occurs with a probability of about 10%. Therefore, only about 10–20% of the energy deposited by a beta particle is available for light production. Because it may be necessary to shift the light produced by such scintillations into the portion of the spectrum to which the photovoltaic cells 14 and 16 are more sensitive, secondary and tertiary phosphors may also need to be added to the LEP material 12. This may result in further degradation of the scintillation efficiency of the LEP material 12. For a more detailed explanation of the operation of scintillators in response to beta radiation, reference is made to E. Schrafm, *Organic Scintillator Detectors*, 1973, pp. 67-74, which is hereby incorporated by reference herein.

In the LEP material 12 of the preferred embodiment, the scintillation efficiency is increased by bringing the primary organic phosphor into a weak bonding with the tritiated organic polymer. Because the beta particle emitted by the tritium is of such low energy, the closer the tritium is located to the phosphor, the greater the probability that the beta particle will be able to interact with the phosphor. Because the average mean distance of the path of an emitted beta particle is less than 1 micron, the probabilities of interaction between the beta particle and the phosphor decrease dramatically unless the phosphor is located within that range.

In the preferred embodiment, the LEP material 12 utilizes both a primary and a secondary phosphor. The primary organic phosphor may be any phosphor or scintillant in the groups PPO, PBD, or POPOP that operates to capture the beta particle and emit a photon in the ultraviolet frequency. The secondary phosphor may either be bonded to or admixed with the organic polymer and performs a Stokes shift on the emitted photon to shift its frequency to the desired frequency of the light to be emitted by the LEP material 12. The various techniques for performing a Stokes shift are well known in the art.

Unlike the prior art techniques of admixing the tritium with the phosphor or encapsulating gaseous tritium in a glass vessel, the LEP material 12 utilized by the present invention maximizes the scintillation efficiency of the beta particle and the organic phosphor by positing the tritium relatively near the primary phosphor and by arranging the LEP material 12 such that it is generally optically transparent at the desired frequency of the emitted light. In addition, to minimize any optical blockage of photons emitted by the LEP material 12, it desirable that the catalysts for bonding both the radioisotope and the phosphor or scintillant be completely removed or disappear after the polymerization process.

Figure 3:
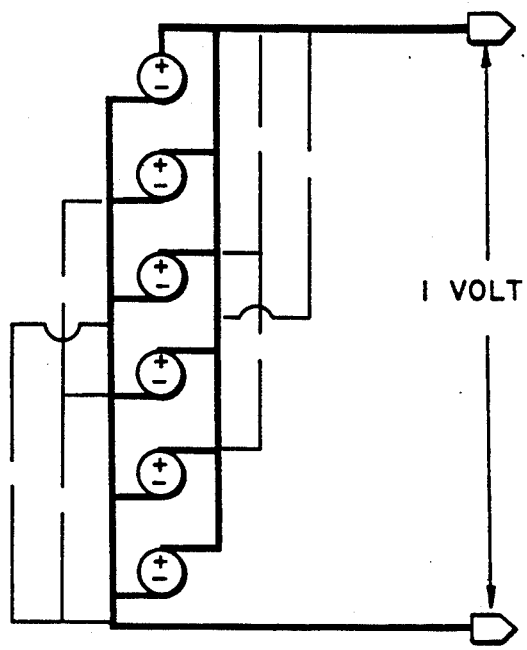
FIGS. 3, 4, 4A, and 5 show different switch configurations of the apparatus of FIG. 2.

Referring now to FIG. 2, the spectral emissions of a blue phosphor and a yellow-green phosphor used as the secondary phosphor in the LEP material 12 are shown. FIG. 3 shows the relative scintillation efficiencies as a function of output voltages over various curie levels in the LEP material 12 utilizing each of these phosphors. As can be seen, the relative efficiency of the yellow-green phosphor decreases with increasing levels of the radioisotope. This effect, known as bleaching, is well known in the field of scintillation. Obviously, it is desirable that the phosphor(s) selected for use with the LEP material 12 should not be subject to bleaching or other types of deterioration as a result of activation by the particular radioisotope selected for use in the LEP material 12.

It should be noted that although the preferred embodiments are described in terms of scintillants that emit energy in the visible spectrum, it is also possible to use a scintillant that emits electromagnetic energy in the ultraviolet, infrared, or other frequency bands of the electromagnetic spectrum. accordingly, the term "light" as used in this application is intended to encompass all frequencies of electromagnetic radiation produced by scintillation activity. For example, if the average mean path of a photon emitted in the ultraviolet spectrum by the primary phosphor is sufficiently great to escape the polymer, and if a photovoltaic cell capable of absorbing energy having a wavelength of 400 nm or less were available, the LEP material 12 might not need a secondary phosphor and the energy emitted by the primary phosphor could be used directly to power the photovoltaic cells 14 and 16. In addition, the bandwidth of the emitted light from the LEP material 12 need not be limited to monochromatic light. Various combinations of primary and/or secondary phosphors in the LEP material could be used to broaden the bandwidth of either or both the intermediary or emitted energy from the LEP material 12. Again, the polymer structure of the LEP material allows the LEP material 12 to be designed to achieve these objectives.

Photovoltaic Cell Efficiencies

Figure 4:
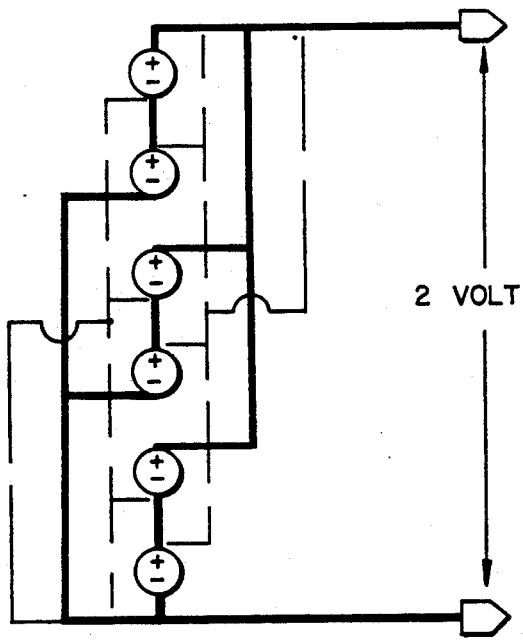
Figure 4A:
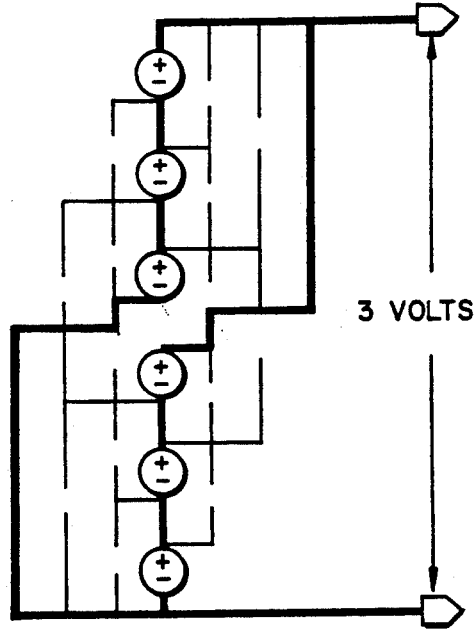

Presently, most of the work, both theoretical and practical, on the design of semiconductor photovoltaic cells relates to their use as solar cells that are designed to absorb all of the spectral energy available from the sun, either at AM0 conditions outside the earth's atmosphere, or at AM1 conditions at sea level. It is well known that there are both theoretical and practical efficiency limits for such solar cells. In theory, there are only two parameters that will determine the efficiency of a solar cell, the band gap energy of the solar cell material and the temperature of the cell. For an amorphous silicon solar cell, the bandgap energy of 1.1eV means that only those photons of wavelengths less than about 1,100 nm are capable of producing electron-hole pairs in the photovoltaic cells that will result in the generation of electrical energy; the remaining energy is lost, usually in the form of heat. Referring now to FIG. 4, the maximum theoretical conversion efficiencies for a variety of photovoltaic cell materials are shown as a function of temperature and energy gap.

In practice, there are a number of other factors that limit the conversion efficiency of solar cells, including the excess energy loss for photons that are within the band gap energy, the fill factor loss and the voltage loss as a result of the mismatch of the impedance of the load and the source. The net result is that typical solar cell efficiencies of only 20% are generally achievable to date. Recently, greater efficiencies have been achieved for a printed compound thin-film photovoltaic cell utilizing the group II-VI compound semiconductors CdS/CdTe. These solar cells, known as the Sunceram TM II, are available from Panasonic's Industrial Battery Sales Div., Secaucus, N.J., and utilize an n-layer (CdS) and a p-layer (CdTe) semiconductor films created by a film-fabrications process that entails paste application by screen printing and sintering in a belt-type furnace. The Sunceram TM II solar cells have an output five times higher than conventional amorphous silicon solar cells when illuminated by tungsten light.

Figure 5:
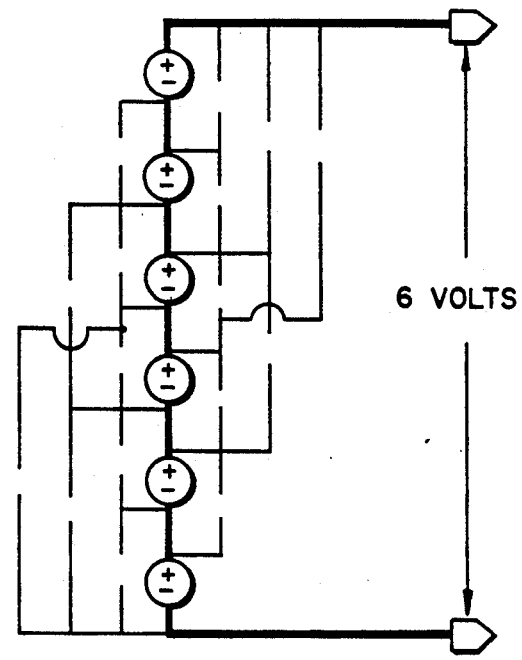

In the present invention, the design parameters of the photovoltaic cell do not have to be matched to the entire bandwidth of visible light to optimize absorption of the entire solar spectrum. Rather, the design of the photovoltaic cells 14 and 16 may be tailored to the particular bandwidth and wavelengths of emitted light from the LEP material 12. It is well known that different semiconductor materials have different bandgap energies and, hence, will absorb photons of different wavelengths (e.g., Si absorbs photons with wavelengths less than <1.1 micrometer and GaAs absorbs photons with wavelengths less than 0.9 micrometer). However, the wavelength of the photon also determines where in the p-n junction the photons will be converted into electron-hole pairs. For short wavelengths (0.55 micrometer), most photons will be converted into electron-hole pairs in a narrow region near the surface of the p-layer of the p-n junction. Whereas, at longer wavelengths (0.9 micrometer), the absorption coefficient for the semiconductor is small and absorption takes place mostly in the n-layer of the p-n junction. FIG. 5 shows the collection efficiency for both the p-layer and the n-layer of a photovoltaic cell as a function of the wavelength of the incident light. The collection efficiency of the photovoltaic cell will be influenced by the minority-carrier diffusion length of the semiconductor material and by the absorption coefficient. A large absorption coefficient leads to heavy absorption near the surface of the p-n junction, resulting in strong collection in the skin layer. A small absorption coefficient allows deep penetration of photons so the base layer of the p-n junction becomes more important in carrier collection. A typical GaAs photovoltaic cell produces more of the skin layer effect, and a typical Si photovoltaic cell produces more of the base layer effect. For a more detailed discussion as to the effect of wavelength and semiconductor selection on the conversion efficiencies of the photovoltaic cell, reference is made to Edward S. Yang, *Fundamentals of Semiconductor Devices*, pp. 147–162 (1978).

In the present invention, the selection of the primary and secondary phosphors of the LEP material 12 can be made to generate a monochromatic or a narrow bandwidth of emitted light, the frequency of which can be matched to the particular type of photovoltaic cell 14 and 16 desired. This matching depends upon the type of conversion desired (base vs. skin effect), the efficiency of the semiconductor material in the bandwidth, and other considerations relating to the design of the electrical energy source 10, including the curie loading, safety factors, the cost, and the environment in which the device will be operated. Although such a device is not currently available, it may be possible to provide a double-sided, monochromatic, bandwidth-matched photovoltaic cell for use with light emitting polymer in the present invention that could achieve conversion efficiencies of 60–70% or higher.

Polymer and Photovoltaic Cell Radiation Damage

The long term performance of a polymer scintillator can be affected by the accumulated radiation dose deposited in the polymer. In addition, a variety of other factors can affect the aging of the polymer. The major variable in pure polymer aging are: (a) radiation intensity and wavelength distribution; (b) ambient temperature; (c) monomer content; (d) level of other impurities; and (e) oxygen concentration in the surrounding atmosphere. To increase the life of the polymer, the last four factors should all be minimized. For the LEP material 12, four additional factors affect the stability and aging of the polymer: (f) radiation resistance and purity of the scintillators used; (g) wavelength of the emitted light (the higher the better); (h) presence of multiple tritium labelled molecules (the lower the better), and (i) radioactive concentration level of the polymer. The basic polymer of the LEP material 12 of the preferred embodiment is known to have one of the lowest coefficients of radiation damage of any polymer.

As for the photovoltaic cells, it is well known that radiation energies in excess of 4KeV can damage the p-n junction in the semiconductor material. If the single conversion process taught by the prior art were used to produce electrical energy, the damage to one $cm^2$ of a p-n junction caused by the beta particles emitted by a one curie of tritium would effectively destroy the p-n junction in a relatively short amount of time. In addition, if a single conversion process were used, the polymer containing the tritium could be no more than 1 micron thick, otherwise the polymer itself would prevent the beta particles from reaching the p-n junction. The present invention allows a double conversion process to be used with a low-level light source and still achieve a conversion efficiency that is equal to or greater than the conversion efficiencies achieved by single conversion processes. By efficiently converting the beta particles to photons in the LEP material 12, the present invention simultaneously solves the problems of radiation damage and the distance that the p-n junction can be located from the energy source. An additional advantage of utilizing the LEP material 12 of the present invention is that the LEP material 12 itself shields the p-n junction of the semiconductor material of the photovoltaic cells 14 and 16 from radiation damage, thereby increasing the useful life of the electrical energy source 10.

Optical Mating Considerations

To maximize the transfer of light emitted by the LEP material 12, the LEP material 12 must be efficiently coupled to the photovoltaic cells 14 and 16. This is achieved by the use of a means for optically coupling the LEP material 12 with the photovoltaic cells 14 and 16 and by creating smooth surfaces on both the LEP material 12 and the photovoltaic cells 14 and 16.

The primary purpose of the means for optically coupling the LEP material 12 and the photovoltaic cells 14 and 16 is to insure that as much of the light that is emitted by the LEP material 12 will be allowed to pass through to the light collecting surface of the photovoltaic cells 14 and 16. Unlike prior art devices, the means for optically coupling the two materials is not required to also serve as a means for isolating the two materials. In one embodiment, an anti-reflective coating matched to the frequency of the emitted light and the indices of refraction of the two materials is used as the means for optically coupling the two materials. Where the index of refraction of the polymer is $n_p$ and the index of refraction of the photovoltaic cell is $n_c$, then the index of refraction of the anti-reflective coating should be the:

$$n_r = (n_p n_c)^{0.5}$$

The index of refraction of silicon is about 3.5 and the index of refraction for most polymers is around 1.5. Thus, the anti-reflective coating should have an index of refraction of about 2.3. The thickness of the anti-reflective coating should be ¼ wavelength of the frequency of the emitted light. A similar effect may also be achieved by the use of an optical coupling gel, such as Rheogel 210C or its equivalent. As with the geometrical considerations to be discussed below, the effect on efficiency of the means for optically coupling the two materials may vary depending upon the materials selected and the manner of their construction.

The light emitting surface of the LEP material 12 and the light collecting surfaces of the photovoltaic cells 14 and 16 should be as smooth as possible to aid in the transmission of light between the two. The existence of a rough interface between the two surfaces will alter the angles of incidence of the various light rays emitted by the LEP material 12 and could allow some of the light rays to be reflected back into the polymer, thereby lengthening their optical path and reducing the probability that they will be re-reflected back into the photovoltaic cells 14 and 16.

It should also be noted that the use of optical concentrators in the optical mating between the LEP material 12 and the photovoltaic cells 14 and 16 could also be used to increase the optical efficiency of the conversion process.

Geometrical Considerations

The preferred method of constructing the LEP material 12 and the photovoltaic cells 14 and 16 is in the planar format shown in FIG. 1. In terms of optical efficiency, the geometrical shape of the LEP material 12 and the photovoltaic cells 14 and 16 will determine, to a certain extent, how much of the emitted light is actually received by the photovoltaic cells 14 and 16. In the planar embodiment shown in FIG. 1, there is a loss of emitted light from the edges of the LEP material 12 not in contact with the photovoltaic cells 14 and 16. For a sheet of LEP material 12 having dimensions of 42 mm × 13 mm × 0.5 mm, there would be a loss of emitted light of approximately 5% due to the optical aperture of $\phi_{critical}$ along the edges of the LEP material 12. This can be demonstrated by calculating the optimum numerical aperture based upon the indices of refraction for each material using Snell's law. This loss can be minimized by cladding the edges of the LEP material with a reflective coating in a manner similar to that known in the fiber optic field; however, the cladding will not achieve the optimum total internal reflection and some of the energy may be still absorbed or lost through the edges of the LEP material 12. Another advantage of the planar embodiment of the present invention is in maximizing the relative amount of surface area available between the LEP material 12 and the photovoltaic cells 14 and 16. The amount of power output available from the photovoltaic cells 14 and 16 is a direct function of the total surface area available for the light collecting surface. In addition, if the thickness of the LEP material is kept small, 0.5 mm, the average mean path of the photons emitted is not consumed by the thickness of the LEP material itself.

In an alternative embodiment shown in FIG. 6, the LEP material 32 is arranged with a double-sided photovoltaic cell 34 in a multiple-layered configuration. In this embodiment the efficiency of the electrical energy source 30 is increased because the emitted light may be absorbed by more than a single photovoltaic cell. In addition, the photovoltaic cell 34 is capable of receiving light from both sides, as well as any light that may have passed through adjacent photovoltaic cells. The photovoltaic cell 34 could be a photovoltaic laminate, for example, constructed of a first semiconductor layer, a first conductive substrate layer, a dielectric isolation layer, a second conductive substrate layer, and a second semiconductor layer. Using the screening technique referred to above for the Sunceram II, the photovoltaic cell 34 might also be constructed as a three-part photovoltaic laminate comprising: semiconductor, dielectric, and semiconductor, with the conductive layer being overlayed by a screening process.

In another embodiment shown in FIG. 7, the LEP material 42 is arranged with a double-sided photovoltaic cell 44 in a jelly-roll spiral configuration. In this embodiment the efficiency of the electrical energy source 40 is increased because of the minimum amount of edge surface relative to the light emitting and light absorbing surfaces of the LEP material 42 and the photovoltaic cell 44. One possible photovoltaic cell for this embodiment may be a new flexible photoelectric material developed by 3M, Minneapolis, Minn., in connection with the center for Amorphous Semiconductors at Iowa State University, Ames, Iowa. The top and bottom of the electrical energy source 40 may also be provided with circular photovoltaic cells (not shown) to further increase the efficiency by capturing any emitted light from the edges of the LEP material 42.

In still another embodiment shown in FIG. 8, the LEP material 52 acts both as the light source for the photovoltaic cell 54 and the structural support for the electrical energy source 50. In this embodiment, the LEP material 52 is cast in the form of a sphere surrounding the photovoltaic cell 54. The photovoltaic cell 54 would also preferably be in the form of a sphere having a screened conductor around the periphery of the sphere. The LEP material 52 could be coated with a reflective material, such as aluminum, thereby insuring total internal reflection of all of the emitted light from the LEP material 52. Each of these spherical cells could be encased in an inactive polymer structure that would serve as the shielding and support for multiple cells for the electrical energy source 50.

It will be apparent that the use of the LEP material 12 as the carrier for the selected radioisotope provides the present invention with numerous advantages in terms of the geometrical and design considerations for constructing the electrical energy source 10. Although only a limited number of possible design combinations of the LEP material 12 and the photovoltaic cells 14 and 16 (or single photovoltaic cell or double-sided photovoltaic cell) have been presented, it should be appreciated that many other designs will be possible because of the nature of the LEP material 12.

Optical Control Means

In still another embodiment of the present invention shown in FIGS. 9 and 10, the LEP material 60 is optically separated from the photovoltaic cells 62 by an optical control means 64 for controlling the amount of light that may be absorbed by the photovoltaic cells 62. The optical control means 64 may be a liquid crystal display (LCD) or lead lantium zirconium titinate (PZLT) or similar material that is either transparent or opaque, depending upon the voltage or current applied to the material. By controlling the amount of light that may be absorbed by the photovoltaic cells 62, the optical control means 64 also controls the output of the photovoltaic cells 62 and, hence, operates as either a voltage or current regulator depending upon the particular circuit that utilizes the electrical energy source of the present invention. The inclusion of the optical control means 64 allows the electrical energy source of the present invention to simulate an alternating current source from a direct current source without the need for any electrical circuitry external to the electrical energy source.

It will be readily apparent that other circuit elements may be incorporated with the electrical energy source 10 of the present invention to optimize the electrical energy source for a particular application. As shown in FIG. 10, a zener diode 76 has been added to establish a fixed voltage level for the output of the electrical energy source 70 having LEP material 72 emitting light energy to be aborbed by the photovoltaic cells 74. A capacitor 78 has also been added to act as an internal electrical storage device that would be charged up to a predetermined voltage level over a given time period and then utilized to power the desired circuit for a relatively shorter time period, after which the electrical energy source 70 would recharge the capacitor 74 for the next demand period. In this way, the large amphour power of the electrical energy source 70 may be realized in applications where an intermittent power demand is required, but the demand is higher than the steady state power (either current or voltage) supplied by the electrical energy source 70. For example, if the electrical energy source 70 were used to power a telemetry detection/transmission circuit, such a circuit could be designed to have the detection portion run off the steady state power of the electrical energy source, with the transmission portion of the circuit powered for short durations by the capacitor 74.

Electrical Considerations

Not only is the electrical energy source 10 of the present invention unique as a battery because of its relatively long-life, other electrical characteristics of the electrical energy source 10 of the present invention make it particularly well-suited for certain applications. Based upon the test data reported in Tables II and III below, the internal impedance of the electrical energy sources in accordance with the present invention is calculated at approximately 5M Ohms. This high impedance is particularly desirable for low-power applications, such as CMOS and NMOS devices. Because the impedance of the load is easily matched to the impedance of the source, it is easier to achieve the maximum output from the electrical energy source of the present invention. The nature of the source of the electrical energy of the present invention, namely a generally constant rate of radioactive decay, allows the electrical energy source 10 to be short circuited without causing any damage to the device and, more importantly, without affecting the power available in the device at some time in the future. Unlike low-power chemical batteries, the electrical energy source of the present invention does not release all of its "stored" energy when it is short circuited. This means that there is no risk of explosion or damage to the device as a result of the short circuit. Also, when the short circuit is removed from the electrical energy source 10, the output of the device is immediately restored to its pre-short state. This allows the electrical energy source 10 to easily act as an ideal constant voltage source, even after the source has been short circuited.

Sample Results

The following tables set forth the measured voltage output of the circuit shown in FIG. 10 having a single electrical energy source in accordance with the present invention and utilizing both the blue and yellow-green phosphors for various curie levels. The LEP material was placed in intimate physical and optical contact with a single specially calibrated photovoltaic cell Model No. 035-015817-01, available from ARCO Solar, Inc., having dimensions of 38×17 mm. The measured voltages are measured in millivolts in parallel with a 10 Mohm input impedance of the volt meter used to take the measurements:

TABLE II

| | Blue Phosphor | | | |
|---|---|---|---|---|
| | 1 Ci/g | 5 Ci/g | 25 Ci/g | 50 Ci/g |
| Dimensions (mm) | 45 × 15 × 1 | 41 × 15 × 1 | 47 × 15 × 1 | 48 × 15 × 1 |
| Total curies | 0.62 | 2.7 | 15 | 34 |
| Load (ohms) | | | | |
| 1K | 0.00 | 0.05 | 0.15 | 0.3 |
| 4.7K | 0.1 | 0.1 | 0.7 | 1.3 |
| 10K | 0.1 | 0.2 | 1.3 | 2.6 |
| 22K | 0.2 | 0.6 | 3.0 | 6.1 |
| 47K | 0.3 | 1.1 | 5.8 | 2.0 |
| 68K | 0.5 | 1.6 | 8.8 | 18.1 |
| 100K | 0.75 | 2.4 | 13.1 | 27.1 |
| 150K | 1.05 | 3.5 | 18.7 | 38.6 |
| 220K | 1.5 | 4.9 | 26.6 | 54.7 |
| 330K | 2.3 | 7.9 | 42.7 | 88.3 |
| 470K | 3.0 | 10.1 | 54.7 | 112.7 |
| 680K | 4.6 | 15.4 | 83.4 | 171.6 |
| 1M | 5.9 | 19.8 | 107.1 | 220 |
| 2.2M | 11.4 | 38.3 | 206 | 421 |
| 4.7M | 20.4 | 68.3 | 365 | 727 |
| 10M | 29.4 | 97.9 | 516 | 984 |
| | Output Voltages (millivolts) | | | |

TABLE III

| | Yellow-Green Phosphor | | | |
|---|---|---|---|---|
| | 1 Ci/g | 5 Ci/g | 25 Ci/g | 50 Ci/g |
| Dimensions (mm) | 35 × 15 × 1 | 47 × 15 × 1 | 55 × 15 × 1 | 49 × 15 × 1 |
| Total curies | 0.46 | 2.83 | 13.7 | 31.6 |
| Load (ohms) | | | | |
| 1K | 0.00 | 0.0 | 0.1 | 0.1 |
| 4.7K | 0.00 | 0.1 | 0.3 | 0.4 |
| 10K | 0.0 | 0.2 | 0.7 | 0.8 |
| 22K | 0.1 | 0.5 | 1.6 | 1.9 |
| 47K | 0.2 | 0.8 | 3.1 | 3.8 |
| 68K | 0.2 | 1.3 | 4.6 | 5.7 |
| 100K | 0.3 | 1.9 | 6.9 | 8.4 |
| 150K | 0.45 | 2.7 | 9.9 | 12.1 |
| 220K | 0.65 | 3.8 | 14.0 | 17.1 |
| 330K | 1.05 | 6.1 | 22.5 | 27.6 |
| 470K | 1.25 | 7.9 | 28.7 | 35.2 |
| 680K | 2.0 | 12.1 | 43.8 | 53.7 |
| 1M | 2.5 | 15.5 | 56.3 | 68.9 |
| 2.2M | 4.9 | 29.9 | 108.4 | 132.5 |
| 4.7M | 8.7 | 52.9 | 190.7 | 233 |
| 10M | 12.4 | 75.9 | 271.0 | 330 |
| | Output Voltages (millivolts) | | | |

Although the description of the preferred embodiment has been presented, it is contemplated that various changes could be made without deviating from the spirit of the present invention. Accordingly, it is intended that the scope of the present invention be dictated by the appended claims rather than by the description of the preferred embodiment.

Numerous substitutions and modifications can be undertaken without departing from the true spirit and scope of the invention as defined in the following claims.

We claim:

1. A power supply comprising:
   a) a phosphor which radiates light in response to nuclear decay of an isotope;

b) a plurality of photovoltaics optically coupled to the phosphor and electrically connected to each other, each of which produces a current which decreases as time progresses; and c) means for selectively changing the electrical interconnections among the photovoltaics in response to the progression of time, for maintaining the total output voltage provided by them.

2. A power supply, comprising:

a) a plurality of photovoltaic units which produce electric power at rate which decays as time progresses;

b) compensation means for maintaining the voltage of the electric power above a predetermined minimum in response to the progression of time;

c) phosphor means for supplying light to the photovoltaic units; and d) isotope means for producing nuclear decay products and inducing the phosphor to produce the light.

3. A power supply, comprising:

a) isotope means for producing radiation which causes a phosphor means to produce light of an intensity which decays with time;

b) a plurality of photovoltaics for receiving the light and producing an electric current in response; and c) a system of switches which progressively places the electric current of more of the photovoltaics into electrical series connection as time progresses.

4. A regulated power supply, comprising:

a) a phosphor which is induced to produce light in response to radiation produced by nuclear decay of a substance;

b) a plurality of photovoltaics, each of which
 i) receives some of the light and
 ii) produces a voltage in response;

c) a load to be supplied by the photovoltaics; and d) means for selectively connecting the photovoltaics in different ways to the load, in order to maintain the voltage applied to the load in response to the progression of time.

5. A method of supplying electrical power to a load, comprising the following steps:

a) generating the electrical power by illuminating a plurality of photovoltaics with light produced by phosphors;

b) irradiating the phosphors with nuclear radiation originating from a source, such that:
 i) the intensity of radiation produced by the source diminishes as time progresses; and
 ii) the photovoltaics initially produce more power than needed by the load; and c) in response to the progression of time, periodically changing the interconnections among the photovoltaics such that the voltage provided to the load is maintained after each change.

6. A regulated power supply, comprising:

a) phosphor means which is induced to radiate light in response to radiation produced by nuclear decay of a substance;

b) a plurality of photovoltaics, each of which
 i) receives some of the light and
 ii) produces a voltage in response;

c) sequence means for altering the interconnections among the photovoltaics, such that more photovoltaics are electrically connected in series as time progresses.

7. Apparatus according to claim 6 in which the sequence means includes a timing means, and in which the alteration is performed according to a predetermined time schedule.

* * * * *